(12) United States Patent
Fujimoto et al.

(10) Patent No.: US 8,404,769 B2
(45) Date of Patent: Mar. 26, 2013

(54) PROCESS FOR PRODUCING RESIN VARNISH CONTAINING SEMI-IPN COMPOSITE THERMOSETTING RESIN AND, PROVIDED USING THE SAME, RESIN VARNISH FOR PRINTED WIRING BOARD, PREPREG AND METAL-CLAD LAMINATE

(75) Inventors: Daisuke Fujimoto, Ibaraki (JP); Yasuyuki Mizuno, Ibaraki (JP); Kazutoshi Danjoubara, Ibaraki (JP); Hikari Murai, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 763 days.

(21) Appl. No.: 12/596,165

(22) PCT Filed: Apr. 25, 2008

(86) PCT No.: PCT/JP2008/058010
§ 371 (c)(1), (2), (4) Date: Oct. 16, 2009

(87) PCT Pub. No.: WO2008/136373
PCT Pub. Date: Nov. 13, 2008

(65) Prior Publication Data
US 2010/0129676 A1    May 27, 2010

(30) Foreign Application Priority Data
Apr. 26, 2007   (JP) ................................ 2007-116785

(51) Int. Cl.
*C08K 3/26* (2006.01)
*B32B 15/08* (2006.01)

(52) U.S. Cl. ........................................ 524/425; 428/462

(58) Field of Classification Search ................. 524/425
See application file for complete search history.

(56) References Cited

FOREIGN PATENT DOCUMENTS

| EP | 1 985 654 A1 | 10/2008 |
|---|---|---|
| JP | 56-133355 | 10/1981 |
| JP | 58-69046 | 4/1983 |
| JP | 58-164638 | 9/1983 |
| JP | 59-193929 | 11/1984 |
| JP | 60-099162 | 6/1985 |
| JP | 61-18937 | 1/1986 |
| JP | 61-286130 | 12/1986 |
| JP | 62-148512 | 7/1987 |
| JP | 63-159443 | 7/1988 |
| JP | 02-208355 | 8/1990 |
| JP | 03-275760 | 12/1991 |
| JP | 06-179734 | 6/1994 |
| JP | 06-184213 | 7/1994 |
| JP | 08-225665 | 9/1996 |
| JP | 11012456 A * | 1/1999 |
| JP | 2004-292825 | 10/2004 |
| JP | 2005-105016 | 4/2005 |
| JP | 2007-302876 | 11/2007 |
| JP | 2007-302877 | 11/2007 |

OTHER PUBLICATIONS

Translation of JP 11012456, Jan. 19, 1999.*

* cited by examiner

*Primary Examiner* — Hui Chin
(74) *Attorney, Agent, or Firm* — Antonelli, Terry, Stout & Kraus, LLP.

(57) ABSTRACT

Provided is a process for producing a thermosetting resin varnish containing a thermosetting resin composition, which contains an uncured semi-IPN composite, an inorganic filler, and a saturated thermoplastic elastomer, wherein the process includes the steps of: (i) preliminary reacting (B) a butadiene polymer which contains in the molecule thereof 40% or more of a 1,2-butadiene unit having a 1,2-vinyl group in the side chain thereof, and which is not chemically modified and (C) a crosslinking agent, in the presence of (A) a polyphenylene ether to obtain a polyphenylene ether-modified butadiene prepolymer which is an uncured semi-IPN composite; (ii) mixing together (D) an inorganic filler and (E) a saturated thermoplastic elastomer to obtain a mixture; and (iii) mixing together the obtained mixture and the polyphenylene ether-modified butadiene prepolymer; and a resin varnish, a prepreg, and a metal-clad laminate provided using the same.

29 Claims, 1 Drawing Sheet

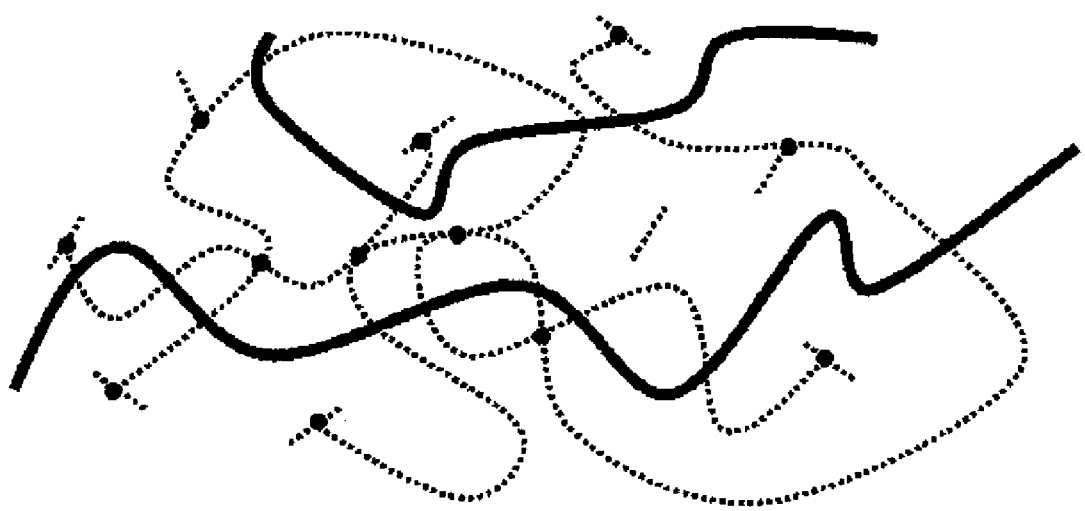

PROCESS FOR PRODUCING RESIN VARNISH CONTAINING SEMI-IPN COMPOSITE THERMOSETTING RESIN AND, PROVIDED USING THE SAME, RESIN VARNISH FOR PRINTED WIRING BOARD, PREPREG AND METAL-CLAD LAMINATE

FIELD OF THE INVENTION

The present invention relates to a process for producing a resin varnish containing a thermosetting resin of semi-IPN composite and, a resin varnish for printed circuit board, a prepreg, and a metal-clad laminate obtained by using the same. More particularly, the present invention concerns a process for producing a novel resin varnish for printed circuit board usable in an electronic device having an operating frequency of more than 1 GHz and, a resin varnish for printed circuit board, a prepreg, and a metal-clad laminate obtained by using the process.

BACKGROUND INVENTION

Mobile communication devices including cell phones as representative examples and devices for their base stations, network-associated electronic devices, such as a server and a router, large-size computers, and the like are demanded to transmit and process a large amount of data with low loss at a high speed. For transmitting and processing a large amount of data at a high speed; an electric signal having a high frequency is needed. However, basically, the higher the frequency, the more likely the electric signal attenuates. That is, the electric signal having a higher frequency has properties such that the output is likely to weaken in a shorter transmission distance to cause large loss. Therefore, for meeting the demands for the above transmission and processing of data with low loss at a high speed, the printed circuit board mounted on the device for transmission and processing of data must be improved in its properties to further reduce the transmission loss, particularly, transmission loss in a high frequency band.

For obtaining a printed circuit board having a low transmission loss, substrate materials using a fluororesin having a low relative permittivity and a low dielectric loss tangent have conventionally been used. However, the fluororesin generally has a high melt temperature, a high melt viscosity, and relatively low flowability, and therefore has a problem in that high-temperature and high-pressure conditions must be employed in the pressing for the fluororesin. In addition, the fluororesin also has a problem in that, when applied to the use of high-multilayer printed circuit board for use in the above-mentioned communication devices, network-associated electronic devices, large-size computers, and others, the fluororesin is unsatisfactory in the workability, dimensional stability, and adhesion to the metal plating.

Therefore, as a substitute for the fluororesin, resin materials for printed circuit board which meet the requirements of the high frequency application are being studied. Of these resin materials, the use of polyphenylene ether known as one of the resins having the most excellent dielectric properties among the heat-resistant polymers has attracted attention. However, like the fluororesin, the polyphenylene ether is a thermoplastic resin having a high melt temperature and a high melt viscosity. Therefore, when applied to the use of printed circuit board, for lowering the melt temperature and melt viscosity of the resin so that lower-temperature and lower-pressure conditions can be employed in the pressing, or for imparting to the resin a heat resistance at the melt temperature of polyphenylene ether (230 to 250° C.) or higher, a resin composition using polyphenylene ether and a thermosetting resin in combination has conventionally been used.

For example, a resin composition using a polyphenylene ether and an epoxy resin in combination (see Patent document 1), a resin composition using a polyphenylene ether and a bismaleimide in combination (see Patent document 2), a resin composition using a polyphenylene ether and a cyanate ester in combination (see Patent document 3), a resin composition using a polyphenylene ether, a styrene-butadiene copolymer or polystyrene, and triallyl cyanurate or triallyl isocyanurate in combination (see Patent documents 4 and 5), a resin composition using a polyphenylene ether and a polybutadiene in combination (see Patent documents 6 and 7), a resin composition obtained by preliminarily-reacting modified polybutadiene having a functional group, such as a hydroxyl group, an epoxy group, a carboxyl group, or a (meth)acryl group, and bismaleimide and/or cyanate ester (see Patent document 8), a resin composition using a polyphenylene ether having added or grafted thereon a compound having an unsaturated double bond-containing group and the above triallyl cyanurate, triallyl isocyanurate, or polybutadiene in combination (see Patent documents 9 and 10), a resin composition using a reaction product of a polyphenylene ether and an unsaturated carboxylic acid or unsaturated acid anhydride and the above bismaleimide in combination (see Patent document 11), a resin composition using a low molecular-weight (oligomer) type polyphenylene ether oligomer having an unsaturated double bond-containing group at the end thereof and polybutadiene or a styrene-butadiene copolymer in combination, and a resin composition using the above polyphenylene ether resin composition and an inorganic filler in combination (see Patent document 12) have been proposed. These patent documents disclose that, for removing the above-mentioned disadvantages of the thermoplastic resin while maintaining the low transmission loss of the polyphenylene ether, it is preferred that the cured resin does not have many polar groups.

[Patent Document 1] Japanese Patent Application Laid-Open No. 58-69046
[Patent Document 2] Japanese Patent Application Laid-Open No. 56-133355
[Patent Document 3] Japanese Published Examined Application No. 61-18937
[Patent Document 4] Japanese Patent Application Laid-Open No. 61-286130
[Patent Document 5] Japanese Patent Application Laid-Open No. 3-275760
[Patent Document 6] Japanese Patent Application Laid-Open No. 62-148512
[Patent Document 7] Japanese Patent Application Laid-Open No. 59-193929
[Patent Document 8] Japanese Patent Application Laid-Open No. 58-164638
[Patent Document 9] Japanese Patent Application Laid-Open No. 2-208355
[Patent Document 10] Japanese Patent Application Laid-Open No. 6-184213
[Patent Document 11] Japanese Patent Application Laid-Open No. 6-179734
[Patent Document 12] Japanese Patent Application Laid-Open No. 2005-105061

DISCLOSURE OF THE INVENTION

Problems to be Solved by the Invention

The present inventors have made close studies on the application of the resin composition using polyphenylene ether and a thermosetting resin in combination, representatively described in Patent documents 1 to 12, to possibility for the use of laminate for printed circuit board.

As a result, with respect to the resin composition described in each of Patent documents 1, 2, and 11, after being cured, the dielectric properties deteriorated due to the effect of the epoxy resin or bismaleimide which is highly polar, which indicates that the resin composition is unsuitable for the high frequency application.

With respect to the composition using polyphenylene ether and cyanate ester in combination described in Patent document 3, the dielectric properties were excellent, but the heat resistance was lowered after moisture absorption.

With respect to the composition using polyphenylene ether and triallyl cyanurate or triallyl isocyanurate in combination described in each of Patent documents 4, 5, 9, and 10, the relative permittivity was slightly higher, and further the dielectric properties tended to remarkably drift due to moisture absorption.

With respect to the resin composition using polyphenylene ether and polybutadiene in combination described in each of Patent documents 4 to 7 and 10, the dielectric properties were excellent, but there were problems in that the resin itself had a low strength and a high thermal expansion coefficient, which indicates that the resin composition is unsuitable for the application of high-multilayer printed circuit board.

Patent document 8 discloses the resin composition using polyphenylene ether and modified polybutadiene in combination for improving the adhesion to a metal or glass substrate. However, this resin composition had a problem in that the dielectric properties markedly deteriorated, particularly in a high frequency band of 1 GHz or more, as compared to those of a resin composition using unmodified polybutadiene.

With respect to the composition using a reaction product of polyphenylene ether and an unsaturated carboxylic acid or unsaturated acid anhydride described in Patent document 11, due to the effect of the unsaturated carboxylic acid or unsaturated acid anhydride which is highly polarity, the dielectric properties more markedly deteriorate than those of a composition using general polyphenylene ether.

With respect to the composition using a low molecular-weight (oligomer) type polyphenylene ether oligomer having an unsaturated double bond-containing group at the end thereof and a thermosetting resin, such as polybutadiene, in combination described in Patent document 12, the curable polyphenylene ether oligomer per se has dielectric properties poorer than those of not only general polyphenylene ether but also the cured product of polybutadiene homopolymer resin. In other words, in this composition, excellent dielectric properties inherent in the polyphenylene ether deteriorate, and therefore the dielectric properties of the cured composition are poorer than those of a composition using general polyphenylene ether. In addition, the curable polyphenylene ether oligomer remarkably increases the cost, as compared to the general polyphenylene ether.

It is considered that there is demand for the composition which has solved the above problems, namely, the thermosetting resin composition containing polyphenylene ether, which has removed the above-mentioned disadvantages of the thermoplastic resin and which exhibits excellent dielectric properties.

Further, the present inventors have paid attention to the dielectric properties, particularly the reduction of the transmission loss, and made studies. As a result, it has been found that only the process of using a resin having a low permittivity and a low dielectric loss tangent cannot satisfy the requirements of the electric signal having a high frequency further increased in recent years. The transmission loss of electric signal is classified into loss caused due to the insulating layer (dielectric loss) and loss caused due to the conductor layer (conductor loss), and hence, when a resin having a low permittivity and a low dielectric loss tangent is used, only the dielectric loss is reduced. For further reducing the transmission loss, it is necessary to also reduce the conductor loss.

As a process for reducing the conductor loss, for example, a process can be used in which a metal-clad laminate using a metallic foil having small surface roughness on the roughened surface side (hereinafter, referred to as "M side") corresponding to the bonding surface between the conductor layer and the insulating layer, specifically, a metallic foil having an M-side surface roughness (ten-point average roughness; Rz) of 5 μm or less (hereinafter, referred to as "low-profile foil") is employed.

The present inventors have conducted studies on the use of a thermosetting resin having a low permittivity and a low dielectric loss tangent as a material for the printed circuit board for use in the high frequency application and the use of a low-profile foil as a metallic foil.

As a result of the studies conducted by the present inventors, it has been found that, with respect to the laminate formed using the resin composition described in each of Patent documents 1 to 12 and a low-profile foil, the adhesion (bonding force) between the insulating (resin) layer and the conductor (metallic foil) layer is too small to secure the required peeling strength of the metallic foil from the resin. The reason for this is presumed that the polarity of resin is low and further the anchoring effect of the metallic foil is poor due to the small roughness of the M side. Further, in a heat resistance test after moisture absorption for the laminate, peeling disadvantageously occurred between the resin and the metallic foil. The reason for this is presumed that the bonding force between the resin and the metallic foil is small. From these results, the present inventors have found that the resin compositions described in Patent documents 1 to 12 have, in addition to the above-mentioned problems, a problem in that it is difficult to use the resin composition and a metallic foil having small surface roughness, such as a low-profile foil, to form a laminate.

Particularly, the resin system of polyphenylene ether and a butadiene homopolymer posed the following serious problems. These resins are inherently incompatible with each other, and it is difficult to obtain a homogeneous resin composition from these resins. Therefore, when the resin composition containing these resins is used as such, the resin composition in an uncured state has a problem of tackiness due to the drawback of the butadiene homopolymer, making it impossible to obtain a prepreg having smooth appearance and excellent handling properties. Further, when a prepreg produced from such a resin composition and a metallic foil are used to form a metal-clad laminate, the resins are cured in a heterogeneous state (a state of macro phase separation). Therefore, in addition to the problem of external appearance, there occurs a decrease in the heat resistance after moisture absorption, and the defects of the butadiene homopolymer system are more marked, and various troubles such as low fracture strength or large thermal expansion coefficient occurred.

Further, the metallic foil peeling strength is too low to apply a low-profile foil to the metal-clad laminate. Such a low metallic foil peeling strength is presumed to be caused by the low cohesive failure strength of the resin near the metallic foil upon peeling rather than the low interface bonding force between the butadiene homopolymer and the metallic foil.

Accordingly, for solving the above problems, it is an object of the present invention to provide a process for producing a resin varnish from which a printed circuit board can be produced wherein the printed circuit board has excellent dielectric properties particularly in a high frequency band and has a small change in the dielectric properties after moisture absorption, and can significantly reduce the transmission loss, and exhibits excellent heat resistance after moisture absorption and excellent thermal expansion properties and satisfies the metallic foil peeling strength, a resin varnish, a prepreg, and a metal-clad laminate obtained by using the same.

The embodiments of the present invention are not limited to the invention which solves all the problems accompanying the prior art.

Means to Solve the Problems

Japanese Patent Application No. 2007-116785, which is the basic application of the present invention claiming the priority, is collectively involved in the present specification for all purposes.

The present inventors have conducted extensive and intensive studies on the resin composition containing a polyphenylene ether with a view toward solving the above-mentioned problems accompanying the conventional resin composition. As a result, they have found a novel process for producing a resin varnish comprising a polyphenylene ether-modified butadiene polymer which is an uncured semi-IPN composite having a novel construction in which a polyphenylene ether and a prepolymer of a chemically unmodified butadiene polymer and a crosslinking agent are compatibilized with each other, an inorganic filler, and a saturated thermoplastic elastomer, wherein the process comprises mixing together the inorganic filler and saturated thermoplastic elastomer and then mixing together the resultant mixture and the polyphenylene ether-modified butadiene polymer to produce a resin varnish, and a resin varnish produced by the novel and unique process has been achieved. In addition, it has been found that, when using the resin varnish in a printed circuit board, the resultant printed circuit board has excellent dielectric properties in a high frequency band and excellent moisture absorption dependency of the dielectric properties, and hence can advantageously reduce the transmission loss and exhibit excellent heat resistance (particularly, heat resistance after moisture absorption) and low thermal expansion properties. Further, it has been found that a laminate for printed circuit board using the resin varnish has high metallic foil peeling strength and therefore can use therein a metallic foil having small surface roughness, particularly a low-profile foil, and the present invention has been completed.

Specifically, the present invention is directed to a process for producing a thermosetting resin varnish containing a thermosetting resin composition, which contains an uncured semi-IPN composite, an inorganic filler, and a saturated thermoplastic elastomer, wherein the process comprises the steps of preliminary reacting, (B) a butadiene polymer which contains in the molecule thereof 40% or more of a 1,2-butadiene unit having a 1,2-vinyl group in the side chain thereof, and which is not chemically modified and (C) a crosslinking agent, in the presence of (A) a polyphenylene ether to obtain a polyphenylene ether-modified butadiene prepolymer which is an uncured semi-IPN composite; mixing together (D) an inorganic filler and (E) a saturated thermoplastic elastomer to obtain a mixture; and mixing together the obtained mixture and the polyphenylene ether-modified butadiene prepolymer which is an uncured semi-IFN composite.

The present invention is directed to the process for producing a thermosetting resin varnish, wherein the step for mixing together the mixture and the polyphenylene ether-modified butadiene prepolymer is performed at a temperature of 60° C. or lower.

The present invention is directed to the process for producing a thermosetting resin varnish, wherein, in the step for obtaining a polyphenylene ether-modified butadiene prepolymer, the polyphenylene ether-modified butadiene prepolymer is obtained by preliminary reacting so that a conversion rate of the component (C) becomes in the range of from 5 to 100%.

The present invention is directed to the process for producing a thermosetting resin varnish, wherein the component (C) contains at least one maleimide compound represented by the following general formula (1):

[Chemical formula 1]

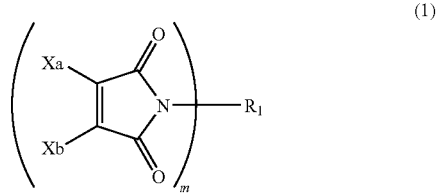

wherein $R_1$ is an m-valent aliphatic or aromatic organic group, Xa and Xb may be the same or different and each is a monovalent atom or organic group selected from a hydrogen atom, a halogen atom, and an aliphatic organic group, and m represents an integer of 1 or more.

The present invention is directed to the process for producing a thermosetting resin varnish, wherein the component (C) is at least one maleimide compound selected from the group consisting of N-phenylmaleimide, N-(2-methylphenyl)maleimide, N-(4-methylphenyl)maleimide, N-(2,6-dimethylphenyl)maleimide, N-(2,6-diethylphenyl)maleimide, N-(2-methoxyphenyl)maleimide, N-benzylmaleimide, N-dodecyhnaleimide, N-isopropylmaleimide, and N-cyclohexylmaleimide.

The present invention is directed to the process for producing a thermosetting resin varnish, wherein the component (C) is at least one maleimide compound represented by the following general formula (2):

[Chemical formula 2]

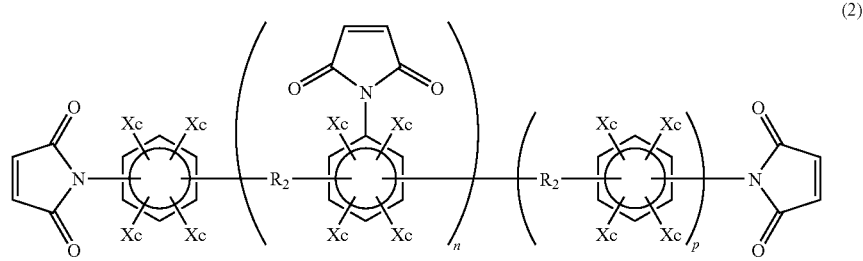

wherein each $R_2$ is —C(Xc)$_2$—, —CO—, —O—, —S—, —SO$_2$—, or a single bond, and each $R_2$ may be the same or different, and each Xc is an alkyl group having 1 to 4 carbon atoms, —CF$_3$, —OCH$_3$, —NH$_2$, a halogen atom, or a hydrogen atom, and each Xc may be the same or different, and their substitution positions on the benzene are independent of one another, and each of n and p represents an integer of 0 to 10.

The present invention is directed to the process for producing a thermosetting resin varnish, wherein the component (C) is at least one maleimide compound selected from the group consisting of 2,2-bis[4-(4-maleimidophenoxy)phenyl]propane, bis(3-ethyl-5-methyl-4-maleimidophenyl)methane, polyphenylmethanemaleimide, and bis(4-maleimidophenyl)methane.

The present invention is directed to the process for producing a thermosetting resin varnish, wherein the component (C) is at least one vinyl compound containing divinylbiphenyl.

The present invention is directed to the process for producing a thermosetting resin varnish, wherein the inorganic filler as component (D) is an inorganic filler selected from alumina, titanium oxide, mica, silica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clay such as calcined clay, talc, aluminum borate, aluminum borate, and silicon carbide, or a mixture of two or more inorganic fillers comprising at least one of those.

The present invention is directed to the process for producing a thermosetting resin varnish, wherein the inorganic filler as component (D) is silica or strontium titanate having a particle size of 0.01 to 30 μm.

The present invention is directed to the process for producing a thermosetting resin varnish, wherein the inorganic filler as component (D) has been subjected to surface treatment with at least one coupling agent selected from silane coupling agents and titanate coupling agents.

The present invention is directed to the process for producing a thermosetting resin varnish, wherein the inorganic filler as component (D) has been subjected to surface treatment with a vinyl group-containing silane coupling agent.

The present invention is directed to the process for producing a thermosetting resin varnish, wherein the inorganic filler as component (D) is preliminarily dispersed in (F) an organic solvent to form a slurry, and then the slurry and the saturated thermoplastic elastomer (E) are mixed together.

The present invention is directed to the process for producing a thermosetting resin varnish, wherein the organic solvent as component (F) is at least one organic solvent comprising a ketone solvent.

The present invention is directed to the process for producing a thermosetting resin varnish, wherein the saturated thermoplastic elastomer as component (E) is at least one saturated thermoplastic elastomer comprising a saturated thermoplastic elastomer obtained by hydrogenating an unsaturated double bond-containing group in the butadiene moiety of a styrene-butadiene copolymer.

The present invention is directed to the process for producing a thermosetting resin varnish, wherein the saturated thermoplastic elastomer as component (E) is preliminarily dissolved in (G) a second organic solvent, and then the resultant solution and the inorganic filler (D) are mixed together.

The present invention is directed to the process for producing a thermosetting resin varnish, wherein the second organic solvent as component (G) is at least one organic solvent comprising an aromatic hydrocarbon solvent or a ketone solvent.

The present invention is directed to the process for producing a thermosetting resin varnish, wherein the amount of the component (A) incorporated is in the range of from 2 to 200 parts by weight, relative to 100 parts by weight of the total amount of the components (B) and (C), the amount of the component (C) incorporated is in the range of from 2 to 200 parts by weight, relative to 100 parts by weight of the component (B), the amount of the component (D) incorporated is in the range of from 1 to 1,000 parts by weight, relative to 100 parts by weight of the total amount of the components (A), (B), (C), and (E), and the amount of the component (E) incorporated is in the range of from 1 to 100 parts by weight, relative to 100 parts by weight of the total amount of the components (A), (B), and (C).

The present invention is directed to the process for producing a thermosetting resin varnish, which further comprises the step of adding (H) a radical reaction initiator.

The present invention is directed to the process for producing a thermosetting resin varnish, which further comprises the step of adding (I) a crosslinkable monomer or crosslinkable polymer containing at least one ethylenically unsaturated double bond-containing group in the molecule thereof.

The present invention is directed to the process for producing a thermosetting resin varnish, wherein the component (I) is at least one crosslinkable monomer or crosslinkable polymer containing an ethylenically unsaturated double bond-containing group selected from the group consisting of chemically unmodified butadiene polymers and maleimide compounds.

The present invention is directed to the process for producing a thermosetting resin varnish, which further comprises the step of adding (J) at least one flame retardant selected from bromine flame retardants and phosphorus flame retardants.

The present invention is directed to a thermosetting resin varnish comprising: a thermosetting resin composition of an uncured semi-IPN composite having compatibilized with one another (A) a polyphenylene ether, (B) a butadiene polymer which contains in the molecule thereof 40% or more of a 1,2-butadiene unit having a 1,2-vinyl group in the side chain thereof, and which is not chemically modified, and (C) a crosslinking agent; (D) an inorganic filler; and (E) a saturated thermoplastic elastomer.

The present invention is directed to the thermosetting resin varnish, which has a viscosity of 10 to 300 mPa·s at 25° C.

The present invention is directed to a resin varnish for printed circuit board, obtained by using the above-mentioned process for producing a thermosetting resin varnish.

The present invention is directed to a prepreg obtained by impregnating a substrate with the above-mentioned resin varnish for printed circuit board or the above-mentioned thermosetting resin varnish, and then drying the resultant substrate at 60 to 200° C.

The present invention is directed to a metal-clad laminate obtained by stacking one or more sheets of the above-mentioned prepreg for printed circuit board on one another to prepare a stacked prepreg, disposing a metallic foil on one side or both sides of the stacked prepreg, and pressing them together while heating.

Effect of the Invention

By the process for producing a resin varnish of the present invention, there can be provided a resin varnish, a prepreg, and a metal-clad laminate, which are advantageous not only in that, when used in a printed circuit board, they exhibit excellent high frequency properties and excellent moisture absorption dependency of them, excellent heat resistance (particularly, excellent heat resistance after moisture absorption), and low thermal expansion properties, but also in that they have metallic foil peeling strength satisfactorily improved. Therefore, the present invention is advantageously used in the application of a member or part for printed circuit board for use in various electric or electronic devices, e.g., mobile communication devices using high frequency signals having, for example, a frequency of 1 GHz or more and devices for their base stations, network-associated electronic devices, such as a server and a router, and large-size computers.

BRIEF DESCRIPTION OF THE DRAWING

FIG. 1 is a diagrammatic view showing a thermosetting resin composition of an uncured semi-IPN composite.

BEST MODE FOR CARRYING OUT THE INVENTION

Hereinbelow, the preferred embodiment of the present invention will be described in detail.

The reason why the thermosetting resin varnish of the present invention, which contains a polyphenylene ether-modified butadiene polymer which is a novel semi-IPN composite, an inorganic filler, and a saturated thermoplastic elastomer, and which is obtained by a process in which the inorganic filler and saturated thermoplastic elastomer are preliminarily mixed together and then the resultant mixture and the polyphenylene ether-modified butadiene polymer are mixed together, can achieve the above task is not clear. The reason is presumed by the present inventors as follows, but the reason does not exclude connection with other factors.

In the present invention, a polyphenylene ether which is a thermoplastic resin having excellent dielectric properties, and a chemically unmodified butadiene polymer known as one of the thermosetting resins exhibiting the most excellent dielectric properties after being cured are used as essential components to remarkably improve the dielectric properties. As mentioned above, the polyphenylene ether and chemically unmodified butadiene polymer are inherently incompatible with each other, and it has been difficult to obtain a homogeneous resin composition from these resins. However, by the process of the present invention using a preliminary reaction, a varnish containing a resin composition having a novel construction in which the resins are thoroughly compatibilized can be obtained.

In the present invention, the term "preliminary reaction" means to generate radicals at a reaction temperature of, for example, 60 to 170° C. while preventing the solvent from volatilizing to effect a reaction of component (B) with component (C), so that a predetermined amount of component (B) is crosslinked and a predetermined amount of component (C) is converted. The mixture obtained after the preliminary reaction is an uncured state, i.e., a state such that gelation does not occur. The mixture of components (A), (B), and (C) before and after the preliminary reaction and the semi-IPN polymer can be easily distinguished from each other from a change of the viscosity, turbidity, or characteristic peak measured by, e.g., liquid chromatography or spectrophotometry. For example, when using an analytical instrument for, e.g., liquid chromatography or spectrophotometry, disappearance of the characteristic peak of component (C) or reduction of the peak ratio is observed after the preliminary reaction.

In the present invention, the term "curing reaction" means to form a B-stage (semi-cured) rein in the application step (in the production of a prepreg or the volatilization step for solvent in the formation of a film), or to generate radicals at the temperature of heat pressing in the production of a copper-clad laminate or solvent volatilization temperature or higher to cure a resin, and is totally different from the preliminary reaction in the present invention. In other words, in the present invention, components (A), (B), and (C) are essential, and an uncured resin having component (A) and components (B) and (C) compatibilized with each other cannot be obtained unless the process of the present invention comprising the step for mixing components (A), (B), and (C) to effect a reaction while stirring is used. Therefore, when a B-stage (semi-cured) resin is formed using a general varnish having the above components merely mixed together, the prepreg or film even in a semi-cured state obtained after solvent volatilization suffers macro phase separation. Further, the cured product using such a resin has suffered phase separation, and hence is even poorer in properties, such as copper foil peeling strength, thermal expansion properties, heat resistance, and moisture absorption properties, than the compatibilized, cured product obtained by the present invention.

In the present invention, in the presence of a polyphenylene ether as component (A), a butadiene polymer as component (B), which contains in the molecule thereof 40% or more of a 1,2-butadiene unit having a 1,2-vinyl group in the side chain thereof and which is not chemically modified, and a crosslinking agent as component (C) are preliminary reacted so that a conversion rate of component (C) (reaction rate) becomes in an appropriate range to form a polyphenylene ether-modified butadiene prepolymer which is in an uncured state such that the polymer is not completely cured and one linear polymer component {corresponding to component (A); portions depicted by the solid lines in FIG. 1} and the other crosslinkable components {corresponding to components (B) and (C); portions depicted by the dotted lines in FIG. 1} together form a so-called "semi-IPN", obtaining a resin varnish containing a homogeneous resin composition (thermosetting resin composition of uncured semi-IPN composite; see FIG. 1). The homogeneous (compatibilized) state of this resin composition is not a state in which component (A) and the other components {partially crosslinked product of components (B) and (C)} form chemical bonds, and is presumed to be an apparently homogenized (compatibilized) state in which the molecular chains of component (A) and the other components are partially and physically entwined with each other into oligomers to form a micro phase separation structure.

From the resin composition containing the polyphenylene ether-modified butadiene prepolymer (thermosetting resin composition of uncured semi-IPN composite), an apparently homogenized resin film can be obtained. In the mixture of a conventionally known polyphenylene ether-modified butadiene prepolymer or polyphenylene ether and polybutadiene, or the mixture of a prepolymer obtained by preliminary-reacting a polybutadiene homopolymer with a bismaleimide compound and a polyphenylene ether, a semi-IPN is not formed and the constituents are not compatibilized with each other, causing phase separation. Therefore, differing from the composition in the present invention, the mixture of a conventionally known polyphenylene ether-modified butadiene prepolymer or polyphenylene ether and polybutadiene, or the mixture of a prepolymer obtained by preliminarily-reacting a polybutadiene homopolymer with a bismaleimide compound and a polyphenylene ether suffers apparently heterogeneous macro phase separation.

A prepreg produced using a resin varnish containing a polyphenylene ether-modified butadiene prepolymer obtained by the process of the present invention (solution containing a thermosetting resin composition of uncured semi-IPN composite) has smooth appearance, and solves the problem of tackiness because the molecules of the butadiene prepolymer crosslinked to some extent and tack-free polyphenylene ether are compatibilized with one another. Further, with respect to the metal-clad laminate produced using the prepreg, there is no problem of the appearance like the prepreg, and the resin composition in the prepreg is cured in such a state that the molecular chains are partially and physically entwined with each other, and therefore, as compared to the cured product of the resin composition in a heterogeneous state, the resultant cured product has an increased pseudocrosslinking density and hence has an improved elastic modulus, thus lowering the thermal expansion coefficient. The improvement of the elastic modulus and the formation of the homogeneous micro phase separation structure can remarkably improve the breaking strength or heat resistance (particularly after moisture absorption) of the resin. Further, the resin improved in breaking strength can exhibit such a high metallic foil peeling strength that a low-profile foil can be used in the metal-clad laminate. Furthermore, it has been found that, by selecting as component (C) a specific crosslinking agent forming a cured product having a feature such that the resin strength or toughness is improved or the molecular motion is restricted, the metallic foil peeling strength and thermal expansion properties can be improved.

Further, it has been found that, by using the polyphenylene ether-modified butadiene prepolymer in the present invention and the inorganic filler as component (D) in combination, not only can the reduction of thermal expansion coefficient, further improvement of heat resistance, and desired control of relative permittivity be achieved, which are generally known as the effect of the addition of inorganic filler, but also the change of the dielectric properties after moisture absorption (moisture absorption dependency) can be reduced while suppressing the deterioration of the dielectric properties. In addition, it has been found that, by using the saturated thermoplastic elastomer as component (E), not only can the impact resistance be improved, but also further excellent dielectric properties can be imparted to the resin composition. Generally, as an impact resistance improving agent for a polyphenylene ether or a compatibilizing agent for improving the compatibility with a thermosetting resin having an unsaturated double bond-containing group, an unsaturated thermoplastic elastomer, such as a styrene-butadiene copolymer, or a crosslinkable polymer is used in combination with a polyphenylene ether, but such a resin composition is lowered in Tg (glass transition temperature). On the other hand, the saturated thermoplastic elastomer which is the essential component in the present invention is inherently less compatible with a butadiene polymer, but the polyphenylene ether-modified butadiene prepolymer in the present invention is remarkably improved in the compatibility with the thermoplastic elastomer, as compared to a conventional butadiene polymer, and, even when using the polyphenylene ether-modified butadiene prepolymer and the saturated thermoplastic elastomer in combination, the resultant resin composition does not sacrifice the homogenization (compatibilization). The saturated thermoplastic elastomer per se has remarkably excellent dielectric properties, as compared to the unsaturated thermoplastic elastomer or crosslinkable polymer. Therefore, when it makes the resin composition containing such a saturated thermoplastic elastomer, a cured product from the resin composition can obtain further excellent high frequency properties. Further, the saturated thermoplastic elastomer has no co-curing properties with the thermosetting component, and the saturated thermoplastic elastomer and other components form a micro phase separation structure in the cured product, preventing the lowering of Tg.

However, when the inorganic filler as component (D) and the saturated thermoplastic elastomer as component (E) are separately mixed into the polyphenylene ether-modified polybutadiene polymer or the polyphenylene ether-modified polybutadiene solution containing a solvent, aggregation of the inorganic filler or phase separation or deposition of the thermoplastic elastomer occurs, so that the inorganic filler or thermoplastic elastomer settles in the resin varnish, making it difficult to form a homogeneous resin varnish. Therefore, the prepreg produced using such a varnish has irregular appearance. Further, the metal-clad laminate produced using this prepreg disadvantageously has not only inconsistent dielectric properties but also increased water absorption due to the aggregation of the inorganic filler.

Various studies of the process for mixing these components have been made. As a result, it has been found that, by preliminarily mixing together the inorganic filler as component (D) and the saturated thermoplastic elastomer as component (E) to obtain a mixture, and then mixing together the mixture and polyphenylene ether-modified butadiene, the dispersibility of the inorganic filler is improved, making it possible to produce a homogeneous resin varnish free from, e.g., phase separation or deposition of the saturated thermoplastic elastomer as component (E). The temperature at which the mixture and polyphenylene ether-modified butadiene are mixed together is preferably 60° C. or lower, more preferably 55° C. or lower, especially preferably 50° C. or lower. When the temperature is 60° C. or lower, neither aggregation of the inorganic filler nor phase separation or deposition of the saturated elastomer occurs, enabling the advantageous production of a varnish. The prepreg produced using this varnish has excellent appearance, and further the metal-clad laminate produced using the prepreg exhibits not only excellent dielectric properties but also reduced water absorption and excellent heat resistance after moisture absorption.

The present invention is directed to a process for producing a resin varnish containing a thermosetting resin composition, which contains an uncured semi-IPN composite, an inorganic filler, and a saturated thermoplastic elastomer, wherein the process comprises the steps of: preliminary reacting, (B) a butadiene polymer which contains in the molecule thereof 40% or more of a 1,2-butadiene unit having a 1,2-vinyl group in the side chain thereof, and which is not chemically modified and (C) a crosslinking agent, in the presence of (A) a polyphenylene ether to obtain a polyphenylene ether-modified butadiene prepolymer which is an uncured semi-IPN composite; mixing together (D) an inorganic filler and (E) a saturated thermoplastic elastomer to obtain a mixture; and mixing together the obtained mixture and the polyphenylene ether-modified butadiene prepolymer. Specifically, the process for producing a resin varnish containing a thermosetting resin composition of a novel semi-IPN composite of the present invention is a process for producing a resin varnish containing a polyphenylene ether-modified butadiene prepolymer obtained by preliminarily-reacting (B) a butadiene polymer which contains in the molecule thereof 40% or more of a 1,2-butadiene unit having a 1,2-vinyl group in the side chain thereof, and which is not chemically modified and (C) a crosslinking agent, in the presence of (A) a polyphenylene ether, (D) an inorganic filler, and (E) a saturated thermoplastic elastomer, wherein the process comprises preliminarily mixing together inorganic filler (D) and saturated thermoplastic elastomer (E), and then mixing together the resultant mixture and the polyphenylene ether-modified butadiene prepolymer. The components of the resin varnish of the present invention, a preferred process for preparing the polyphenylene ether-modified butadiene prepolymer, and a preferred process for preparing the resin composition are described below.

In the present invention, as examples of components (A) used in the preparation of the polyphenylene ether-modified butadiene prepolymer, there can be mentioned poly(2,6-dimethyl-1,4-phenylene) ether or poly(2,3,6-trimethyl-1,4-phenylene) ether obtained by homopolymerization of 2,6-dimethylphenol or 2,3,6-trimethylphenol, and a copolymer of 2,6-dimethylphenol and 2,3,6-trimethylphenol. A polymer alloy of the above polymer and, e.g., polystyrene or a styrene-butadiene copolymer, i.e., so-called modified polyphenylene ether can be used, but, in this case, the polymer more preferably contains a poly(2,6-dimethyl-1,4-phenylene) ether component, a poly(2,3,6-trimethyl-1,4-phenylene) ether component, or a copolymer component of 2,6-dimethylphenol and 2,3,6-trimethylphenol in an amount of 50% or more.

With respect to the molecular weight of component (A), there is no particular limitation, but, from the viewpoint of achieving good balance between the dielectric properties or heat resistance obtained when used in a printed circuit board and the flowability of the resin obtained when used in a prepreg, the number average molecular weight of component (A) is preferably in the range of from 7,000 to 30,000. The number average molecular weight in the present invention is measured by gel permeation chromatography utilizing a calibration curve obtained with respect to standard polystyrene.

In the present invention, with respect to component (B) used in the preparation of the polyphenylene ether-modified butadiene prepolymer, there is no particular limitation as long as it is a butadiene polymer which contains in the molecule thereof 40% or more of a 1,2-butadiene unit having a 1,2-vinyl group in the side chain thereof, and which is not chemically unmodified. Specifically, component (B) is not modified polybutadiene, of which 1,2-vinyl group in the side chain in the molecule or the both ends or one end is chemically modified into, e.g., epoxide, glycol, phenol, maleic acid, (meth)acrylic acid, or urethane, but an unmodified butadiene polymer. When the unmodified polybutadiene is used, excellent dielectric properties, excellent resistance to moisture, and excellent heat resistance after moisture absorption can be maintained. When the butadiene polymer contains in the molecule thereof 40% or more of a 1,2-butadiene unit having a 1,2-vinyl group, a certain amount of crosslinking points can be secured and the resultant resin composition exhibits excellent curing properties, so that the dielectric properties (particularly, dielectric loss tangent), heat resistance (particularly, heat resistance after moisture absorption), and thermal expansion coefficient can satisfy the requirements for the application of the resin varnish to a printed circuit board.

From the viewpoint of achieving excellent curing properties of the resin composition, the content of the 1,2-butadiene unit having a 1,2-vinyl group in the side chain thereof in the molecule of component (B) is more preferably 50% or more, further preferably 65% or more. From the viewpoint of achieving good balance between the curing properties of the resin composition or the dielectric properties of a cured product of the resin composition and the flowability of the resin obtained when used in a prepreg, the number average molecular weight of component (B) is preferably in the range of from 500 to 10,000, more preferably 700 to 8,000, further preferably 1,000 to 5,000. The number average molecular weight is as defined for the number average molecular weight of component (A).

Specific examples of components (B) preferably used in the present invention include commercially available products, such as B-1000, B-2000, B-3000 (trade names, manufactured by NIPPON SODA CO., LTD.), B-1000, B-2000, B-3000 (trade names, manufactured by NIPPON OIL CORPORATION), and Ricon 142, Ricon 150, Ricon 152, Ricon 153, Ricon 154 (trade names, manufactured by Sartomer Company).

In the present invention, component (C) used in the preparation of the polyphenylene ether-modified butadiene prepolymer is a compound having in the molecule thereof a functional group reactive to component (B), for example, a crosslinkable monomer or crosslinkable polymer containing at least one ethylenically unsaturated double bond-containing group in the molecule thereof. Specific examples of components (C) include vinyl compounds, maleimide compounds, diallyl phthalate, (meth)acryloyl compounds, and unsaturated polyesters. Of these, preferred component (C) is at least one maleimide compound or at least one vinyl compound because the maleimide or vinyl compound has excellent co-crosslinkability with component (B) and hence the resultant resin composition has excellent curing properties and excellent storage stability, and there can be obtained excellent total balance between the shapability of the resin composition used in a printed circuit board, dielectric properties, dielectric properties after moisture absorption, thermal expansion properties, metallic foil peeling strength, Tg, heat resistance after moisture absorption, and flame retardancy.

A maleimide compound preferably used as component (C) in the present invention can be a compound containing at least one maleimido group in the molecule thereof and being represented by the general formula (1) below. A monomaleimide compound or polymaleimide compound can be preferably used, and is represented by the general formula (1), (2), (3), (4), or (5) below.

[Chemical formula 3]

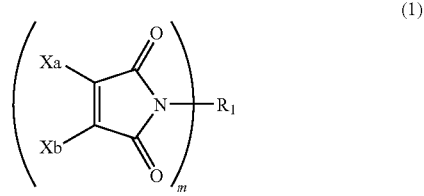

(1)

wherein $R_1$ is a monovalent or multivalent organic group having a valence of m, and being any one of aliphatic, alicyclic, aromatic and heterocyclic, Xa and Xb may be the same or different and each is a monovalent atom or organic group selected from a hydrogen atom, a halogen atom, and an aliphatic organic group, and m represents an integer of 1 or more.

Each of Xa and Xb is preferably a hydrogen atom, and $R_1$ is preferably a phenyl group, an alkylphenyl group, a dialkylphenyl group, or an alkoxyphenyl group. As an example of formula (1), there can be mentioned the following formula (5).

[Chemical formula 4]

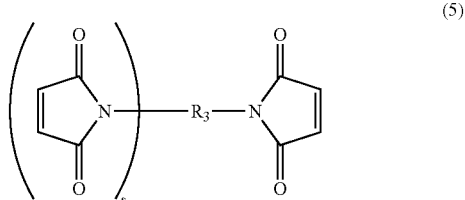

(5)

wherein:
$R_3$ represents a monovalent or divalent aliphatic, alicyclic, aromatic, or heterocyclic organic group, and s represents 0 or 1, wherein when s is 0 and $R_3$ is a monovalent group, $R_3$ is preferably a linear or branched alkyl group having 1 to 18 carbon atoms, a cycloalkyl group having 3 to 8 carbon atoms, an aralkyl group having 7 to 15 carbon atoms, or an unsubstituted aryl group having 6 to 18 carbon atoms or an aryl group having 6 to 18 carbon atoms substituted with an alkyl group having 1 to 4 carbon atoms or an alkoxy group having 1 to 4 carbon atoms, and wherein when s is 1 and $R_3$ is a divalent group, $R_3$ is preferably an alkylene group having 1 to 18 carbon atoms in total, an arylene group having 6 to 15 carbon atoms in total, or a cycloalkylene-alkylene-cycloalkylene group having 7 to 18 carbon atoms in total.

Formula (5) wherein s is 0 corresponds to formula (1) wherein m is 1 and each of Xa and Xb is a hydrogen atom. Formula (5) wherein s is 1 corresponds to formula (1) wherein m is 2 and each of Xa and Xb is a hydrogen atom.

[Chemical formula 5]

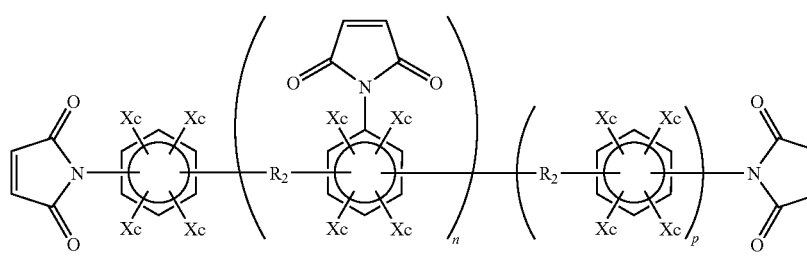

(2)

wherein each $R_2$ is $-C(Xc)_2-$, $-CO-$, $-O-$, $-S-$, $-SO_2-$, or a single bond, and each $R_2$ may be the same or different, and each Xc is an alkyl group having 1 to 4 carbon atoms, $-CF_3$, $-OCH_3$, $-NH_2$, a halogen atom, or a hydrogen atom, and each Xc may be the same or different, and their substitution positions on the benzene are independent of one another, and each of n and p represents 0 or an integer of 1 to 10.

Specific examples of monomaleimide compounds represented by the general formula (1) or (5) include N-phenylmaleimide, N-(2-methylphenyl)maleimide, N-(4-methylphenyl)maleimide, N-(2,6-dimethylphenyl)maleimide, N-(2,6-diethylphenyl)maleimide, N-(2-methoxyphenyl)maleimide, N-benzylmaleimide, N-dodecylmaleimide, N-isopropylmaleimide, and N-cyclohexylmaleimide.

Specific examples of polymaleimide compounds represented by the general formula (2) or (5) include 1,2-dimaleimidoethane, 1,3-dimaleimidopropane, bis(4-maleimidophenyl)methane, bis(3-ethyl-4-maleimidophenyl)methane, bis(3-ethyl-5-methyl-4-maleimidophenyl)methane, 2,7-dimaleimidofluorene, N,N-(1,3-phenylene)bismaleimide, N,N'-[1,3-(4-methylphenylene)]bismaleimide, bis(4-maleimidophenyl)sulfone, bis(4-maleimidophenyl)sulfide, bis(4-maleimidophenyl)ether, 1,3-bis(3-maleimidophenoxy)benzene, 1,3-bis[3-(3-maleimidophenoxy)phenoxy]benzene, bis(4-maleimidophenyl)ketone, 2,2-bis[4-(4-maleimidophenoxy)phenyl]propane, bis[4-(4-maleimidophenoxy)phenyl]sulfone, bis[4-(4-maleimidophenoxy)phenyl]sulfoxide, 4,4'-bis(3-maleimidophenoxy)biphenyl, 1,3-bis[2-(3-maleimidophenyl)propyl]benzene, 1,3-bis{1-[4-(3-maleimidophenoxy)phenyl]-1-propyl}benzene, bis(maleimidocyclohexyl)methane, 2,2-bis[4-(3-maleimidophenoxy)phenyl]-1,1,1,3,3,3-hexafluoropropane, bis(maleimidophenyl)thiophene, and aliphatic, alicyclic, aromatic, or heterocyclic polymaleimides represented by the general formula (3) or (4) below (including their isomers). From the viewpoint of achieving excellent resistance to moisture, excellent heat resistance, high breaking strength, high metallic foil peeling strength, and low thermal expansion properties when used in a printed circuit board, preferred are aromatic polymaleimides. Of these, especially from the viewpoint of achieving further reduced thermal expansion coefficient, bis(3-ethyl-5-methyl-4-maleimidophenyl)methane is more preferably used, and, from the viewpoint of achieving further increased breaking strength and metallic foil peeling strength, 2,2-bis[4-(4-maleimidophenoxy)phenyl]propane is more preferably used. From the viewpoint of improving the shapability of the resin varnish used in a prepreg, preferred is monomaleimide which causes a slow curing reaction, and, of these, from the viewpoint of reducing the cost, N-phenylmaleimide is more preferably used. These maleimide compounds can be used individually or in combination, and at least one of the maleimide compounds and at least one of the above-mentioned crosslinking agents can be used in combination.

With respect to component (C), when the maleimide compound and a crosslinking agent are used in combination, the content of the maleimide compound in component (C) is preferably 50% by weight or more, more preferably 80% by weight or more, especially preferably 100% by weight, that is, component (C) is comprised only of the maleimide compound.

[Chemical formula 6]

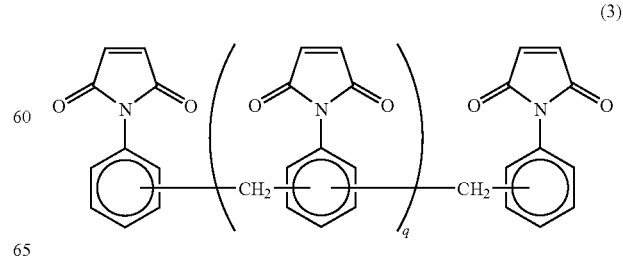

(3)

wherein q is 0 to 10 on an average.

[Chemical formula 7]

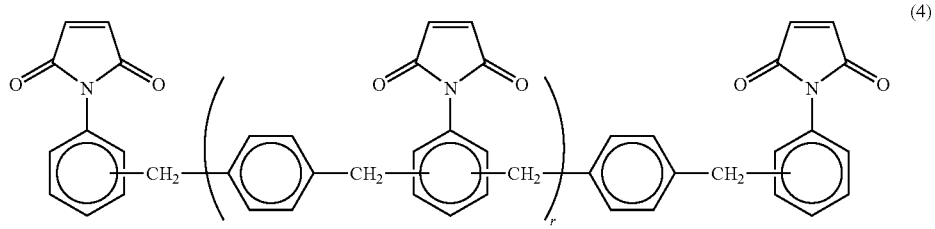

(4)

wherein r is 0 to 10 on an average.

Examples of vinyl compounds preferably used as component (C) include styrene, divinylbenzene, vinyltoluene, and divinylbiphenyl. Preferred is divinylbiphenyl.

Specific examples of compounds preferably used as component (C) in the present invention include commercially available products, such as divinylbiphenyl (manufactured by Nippon Steel Chemical Co. Ltd.).

In the present invention, the polyphenylene ether-modified butadiene prepolymer in the thermosetting resin composition of a novel semi-IPN composite is prepared by preliminarily-reacting component (B) and component (C), in the presence of component (A) preferably developed in a medium, so that no gelation occurs. In this case, components (A), (B), and (C), which are inherently incompatible with one another, form a semi-IPN polymer in which the molecular chains are physically entwined with each other, obtaining an apparently homogenized (compatibilized) prepolymer in an uncured state such that the polymer is not completely cured.

In the present invention, the polyphenylene ether-modified butadiene prepolymer can be prepared by developing component (A) in a medium, for example, dissolving component (A) in a solvent, and then dissolving or dispersing components (B) and (C) in the solution and heating the resultant solution or dispersion at 60 to 170° C. while stirring for 0.1 to 20 hours. When the polyphenylene ether-modified butadiene prepolymer is prepared in the form of a solution, it is preferred that the amount of the solvent used is controlled so that the solids content (nonvolatile content) of the solution becomes generally 5 to 80% by weight. The solvent can be completely removed from the prepared polyphenylene ether-modified butadiene prepolymer by, e.g., concentration to form a resin composition free of solvent, or the polyphenylene ether-modified butadiene prepolymer solution having the prepared prepolymer dissolved or dispersed in the solvent can be used. The solution having a solids content (nonvolatile content) increased by, e.g., concentration can be used.

With respect to the solvent, there is no particular limitation, but preferred is at least one solvent comprising an aromatic hydrocarbon solvent. Specific preferred examples of aromatic hydrocarbon solvents include toluene, xylene, and mesitylene, and these solvents can be used individually or in combination. In the solvent, the aromatic hydrocarbon solvent and another solvent can be used in combination, and, with respect to the solvent used in combination with the aromatic hydrocarbon solvent, there is no particular limitation, but specific examples include alcohols, such as methanol, ethanol, and butanol; ethers, such as ethyl cellosolve, butyl cellosolve, ethylene glycol monomethyl ether, carbitol, and butyl carbitol; ketones, such as acetone, methyl ethyl ketone, methyl isobutyl ketone, and cyclohexanone; esters, such as methoxyethyl acetate, ethoxyethyl acetate, butoxyethyl acetate, and ethyl acetate; and nitrogen-containing solvents, such as N,N-dimethylformamide, N,N-dimethylacetamide, and N-methyl-2-pyrrolidone. These solvents can be used individually or in combination. When a mixed solvent of the aromatic hydrocarbon solvent and another solvent is used, the content of the aromatic hydrocarbon solvent in the mixed solvent is preferably 50% by weight or more, more preferably 70% by weight or more, further preferably 80% by weight or more.

In the resin composition in the present invention, with respect to the amount of each of components (A), (B), and (C) used in the preparation of the polyphenylene ether-modified butadiene prepolymer, the amount of component (A) incorporated is preferably in the range of from 2 to 200 parts by weight, more preferably 10 to 100 parts by weight, further preferably 15 to 50 parts by weight, relative to 100 parts by weight of the total of components (B) and (C). From the viewpoint of achieving good balance between the thermal expansion coefficient, dielectric properties, application workability ascribed to the viscosity of the resin varnish, and shapability of the varnish used in a printed circuit board ascribed to the melt viscosity of the varnish in a prepreg, the amount of component (A) incorporated is preferably determined relative to 100 parts by weight of the total of components (B) and (C). The amount of component (C) incorporated is preferably in the range of from 2 to 200 parts by weight, more preferably 5 to 100 parts by weight, further preferably 10 to 75 parts by weight, relative to 100 parts by weight of component (B). From the viewpoint of achieving good balance between the thermal expansion coefficient, Tg, metallic foil peeling strength, and dielectric properties, the amount of component (C) incorporated is preferably determined relative to 100 parts by weight of component (B).

The polyphenylene ether-modified butadiene prepolymer in the present invention is generally obtained in the preparation thereof by a preliminary reaction so that the conversion rate of component (C) (reaction rate) is in the range of from 5 to 100%. A more preferred range of the conversion rate of component (C) varies depending on the amounts of components (B) and (C) incorporated. When the amount of component (C) incorporated is in the range of from 2 to 10 parts by weight, relative to 100 parts by weight of component (B), the conversion rate of component (C) (reaction rate) is more preferably in the range of from 10 to 100%; when the amount of component (C) is in the range of from 10 to 75 parts by weight, the conversion rate of component (C) (reaction rate) is more preferably in the range of from 15 to 70%, especially preferably 25 to 40%; when the amount of component (C) is in the range of from 75 to 100 parts by weight, the conversion rate of component (C) (reaction rate) is more preferably in the range of from 7 to 90%; and when the amount of component (C) is in the range of from 100 to 200 parts by weight, the conversion rate of component (C) (reaction rate) is more preferably in the range of from 5 to 80%. From the viewpoint of obtaining a resin composition or prepreg which appears to be homogeneous and which is tack-free and achieving excellent heat resistance after moisture absorption, high metallic foil peeling strength, and excellent thermal expansion coefficient when used in a printed circuit board, the conversion rate of component (C) (reaction rate) is preferably 5% or more.

In the present invention, the polyphenylene ether-modified butadiene prepolymer involves one which is obtained by a reaction at a component (C) conversion rate of 100% and one which is obtained by a reaction at a component (C) conversion rate of less than 100% and which contains component (C) remaining unreacted or unconverted.

The conversion rate of component (C) (reaction rate) is determined from the amount of component (C) remaining in the polyphenylene ether-modified butadiene prepolymer, as measured by gel permeation chromatography, and the preliminarily formed calibration curve for component (C).

In the process of the present invention, components (D) and (E) are preliminarily mixed together, and the resultant mixture and the polyphenylene ether-modified butadiene polymer obtained by preliminarily-reacting components (A) to (C) are mixed together to obtain a thermosetting resin varnish. In the process of the present invention, components (D) and (E) are preliminarily mixed together, and therefore component (E) serves as a compatibilizing agent for component (D) and the polyphenylene ether-modified butadiene polymer, improving the dispersibility of the inorganic filler as component (D). The temperature at which the mixture and the polyphenylene ether-modified butadiene polymer are mixed together is further preferably 60° C. or lower because the dispersibility of component (d) is further improved. In contrast, when the inorganic filler as component (D) or the saturated thermoplastic elastomer as component (E) is individually mixed with the polyphenylene ether-modified butadiene polymer, aggregation of the inorganic filler or phase separation or deposition of the elastomer occurs, and a printed circuit board using the resultant resin varnish has low levels of the relative permittivity, dielectric loss tangent, transmission loss, and moisture absorption dependency of the dielectric properties, as compared to that using the polyphenylene ether-modified butadiene polymer in the process of the present invention comprising the step for preliminarily mixing together the inorganic filler as component (D) and the saturated thermoplastic elastomer as component (E) to obtain a mixture. A mixture having components (D) and (E) mixed together may be either a mixture of inorganic filler (D) and saturated thermoplastic elastomer (E) or a mixture of a slurry, which is obtained by preliminarily dispersing component (D) in organic solvent (F), and a solution, which is obtained by preliminarily dissolving elastomer (E) in second organic solvent (G).

With respect to the inorganic filler as component (D) in the present invention, there is no particular limitation, but specific examples of usable inorganic fillers include alumina, titanium oxide, mica, silica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clay such as calcined clay, talc, aluminum borate, and silicon carbide. These inorganic fillers can be used individually or in combination. With respect to the form and particle size of the inorganic filler, there is no particular limitation, but an inorganic filler preferably having a particle size of 0.01 to 30 μm, more preferably 0.1 to 15 μm is advantageously used. When an inorganic filler having a particle size of 0.01 μm or less is used, the flowability of the thermosetting resin is lowered and therefore the shapability of the resin is poor when forming a prepreg or a metal-clad laminate, so that voids and others are likely to be caused, and further the inorganic filler having such a small particle size has a large surface area and hence has reduced bond area between the metal and the resin, disadvantageously lowering the peeling strength in a printed circuit board. On the other hand, when an inorganic filler having a particle size of more than 30 μm is used, the insulation reliability of the wirings and insulating layer in a printed circuit board disadvantageously is lowered.

In the present invention, it is desired that inorganic filler as component (D) has been subjected to surface treatment with at least one coupling agent selected from silane coupling agents and titanate coupling agents. When the inorganic filler treated with the coupling agent is used, the adhesion of the surface of the inorganic filler to the resin is improved, thus lowering the water absorption and improving the heat resistance after moisture absorption and the adhesion to the metal. As a silane coupling agent, carbon functional silane is used, and examples include epoxy group-containing silanes, such as 3-glycidoxypropyltrimethoxysilane, 3-glycidoxypropyl(methyl)dimethoxysilane, and 2-(2,3-epoxycyclohexyl)ethyltrimethoxysilane; amino group-containing silanes, such as 3-aminopropyltriethoxysilane, N-(2-aminoethyl)-3-aminopropyltrimethoxysilane, and N-(2-aminoethyl)-3-aminopropyl(methyl)dimethoxysilane; cationic silanes, such as 3-(trimethoxysilyl)propyltetramethylammonium chloride; vinyl group-containing silanes, such as vinyltriethoxysilane; acryl group-containing silanes, such as 3-methacryloxypropyltrimethoxysilane; and mercapto group-containing silanes, such as 3-mercaptopropyltrimethoxysilane. Of these, a vinyl group-containing silane is especially preferably used because it is capable of reacting with the polyphenylene ether-modified butadiene polymer and is less polar and therefore, the water absorption can be further reduced and the heat resistance after moisture absorption and the adhesion to the metal can be improved. On the other hand, examples of titanate coupling agents include alkyl titanates, such as titanium propoxide and titanium butoxide. These coupling agents or silicone polymers can be used individually or in combination.

With respect to the amount of the coupling agent attached to the inorganic filler as component (D) in the present invention, there is no particular limitation, but, from the viewpoint of achieving excellent dispersibility of the inorganic filler in the resin material or obtaining a cured product having excellent heat resistance, the amount of the coupling agent attached is generally preferably 0.01 to 20% by weight, preferably 0.05 to 10% by weight, more preferably 0.1 to 7% by weight, based on the weight of the inorganic filler.

When a coupling agent is used, with respect to the process of treating component (D) with the coupling agent, there is no particular limitation, but there can be employed either a process in which component (D) is preliminarily subjected to surface treatment by a wet process or a dry process, or a process in which, after the inorganic filler and saturated thermoplastic resin elastomer are mixed together or after the polyphenylene ether-modified butadiene prepolymer or the like is added thereto, a coupling agent is mixed with the resultant mixture for surface treatment of the inorganic filler. It is desired that component (D) preliminarily surface-treated is used. In this case, when the surface treatment is conducted by a wet process, the surface-treated inorganic filler can be used in the form of a slurry having the coupling agent and inorganic filler dispersed in, e.g., the organic solvent as component (F) (dispersing medium). When the surface treatment is conducted by a dry process, the surface-treated inorganic filler can be used in the form of a slurry having the treated inorganic filler dispersed in, e.g., organic solvent (F). With respect to the conditions for the surface treatment including time and temperature, there is no particular limitation.

In the present invention, it is preferred that the inorganic filler as component (D) is preliminarily dispersed in organic solvent (F) to form a slurry and then the slurry and saturated thermoplastic elastomer (E) are mixed together. When the slurry is preliminarily formed, not only be the dispersibility of the inorganic filler improved, but also the dispersibility of the inorganic filler is also excellent after mixed into the resin, making it possible to further improve the heat resistance after moisture absorption and reduce the water absorption.

In the present invention, it is preferred that the organic solvent as component (F) is at least one organic solvent comprising a ketone solvent. In this case, the dispersibility of the inorganic filler is further improved. As a ketone solvent, for example, acetone, methyl ethyl ketone, methyl isobutyl ketone, or cyclohexanone is used. These solvents can be used individually or in combination.

In the resin composition in the present invention, the amount of component (D) incorporated is preferably 1 to 1,000 parts by weight, more preferably 5 to 500 parts by weight, further preferably 10 to 350 parts by weight, relative to 100 parts by weight of the total of components (A), (B), (C), and (E), and the amount of component (D) can be appropriately selected depending on the desired control of the relative permittivity, desired improvement of the heat resistance, and desired shapability of the prepreg. Further, with respect to the amount of component (D) and the amount of component (E) in the resin composition in the present invention, from the viewpoint of obtaining a homogeneous resin varnish free from aggregation of the inorganic filler or phase separation or deposition of the thermoplastic elastomer, the amount of component (E) incorporated is preferably 5 to 500 parts by weight, more preferably 10 to 300 parts by weight, relative to 100 parts by weight of component (D).

With respect to component (E) in the present invention, there is no particular limitation as long as it is a saturated thermoplastic elastomer, but a styrene saturated thermoplastic elastomer having excellent compatibility with component (A) is desired. Specific examples of components (E) preferably used in the present invention include styrene-ethylene-butylene copolymers, which can be obtained by, e.g., a process comprising hydrogenating an unsaturated double bond-containing portion in the butadiene block of a styrene-butadiene copolymer. When the styrene saturated thermoplastic elastomer is used, from the viewpoint of achieving good balance between the compatibility of the elastomer with the polyphenylene ether-modified butadiene prepolymer and the thermal expansion properties obtained after the resin composition is cured, the styrene saturated thermoplastic elastomer preferably has a styrene block content of 20 to 70%. As component (E), a chemically modified saturated thermoplastic elastomer having in the molecule thereof a functional group, such as an epoxy group, a hydroxyl group, a carboxyl group, an amino group, or an acid anhydride, can be used. With respect to component (E), the saturated thermoplastic elastomers can be used individually or in combination, and, when using the styrene saturated thermoplastic elastomer, two types or more of the elastomers having different styrene contents can be used in combination.

In the present invention, it is preferred that the saturated thermoplastic elastomer as component (E) is preliminarily dissolved in (G) a second organic solvent and then the resultant solution and inorganic filler (D) are mixed together. In this case, the saturated thermoplastic elastomer, which per se has low solubility and is difficult to dissolve in the presence of another resin material, can be easily dissolved.

In the present invention, it is preferred that the second organic solvent as component (G) is at least one organic solvent comprising an aromatic hydrocarbon solvent or a ketone solvent. In this case, the solubility of the saturated thermoplastic elastomer becomes further excellent. As an aromatic hydrocarbon solvent, for example, toluene, xylene, or mesitylene is preferred. As a ketone solvent, for example, acetone, methyl ethyl ketone, methyl isobutyl ketone, or cyclohexanone is preferred. These solvents can be used individually or in combination.

In the resin composition in the present invention, the amount of component (E) incorporated is preferably 1 to 100 parts by weight, more preferably 2 to 50 parts by weight, further preferably 5 to 30 parts by weight, relative to 100 parts by weight of the total of components (A), (B), and (C). When the amount of component (E) incorporated is less than 1 part by weight, the effect of improving the dielectric properties tends to be unsatisfactory. On the other hand, when the amount of component (E) is more than 100 parts by weight, the thermal expansion properties of the cured product tend to become poor.

In the present invention, for the purpose of initiating or promoting the preliminary reaction of components (B) and (C) in the preparation of the polyphenylene ether-modified butadiene prepolymer and for the purpose of initiating or promoting the curing reaction of the resin composition contained in the prepreg in the production of the metal-clad laminate or multilayer printed circuit board, it is preferred that the resin varnish contains (H) a radical reaction initiator.

Specific examples of components (H) include peroxides, such as dicumyl peroxide, t-butylcumyl peroxide, benzoyl peroxide, cumene hydroperoxide, 1,1-bis(t-hexylperoxy)-3,3,5-trimethylcyclohexane, 1,1-bis(t-butylperoxy)-2-methylcyclohexane, 1,1-bis(t-hexylperoxy)cyclohexane, 1,1-bis(t-butylperoxy)cyclohexane, 2,2-bis[4,4-di(t-butylperoxy)cyclohexyl]propane, 2,5-dimethylhexane-2,5-dihydroperoxide, 2,5-dimethyl-2,5-bis(t-butylperoxy)hexyne-3, di-t-butylperoxide, α,α'-bis(t-butylperoxy)diisopropylbenzene, 2,5-dimethyl-2,5-bis(t-butylperoxy)hexane, di-t-butyl peroxyisophthalate, t-butyl peroxybenzoate, t-butyl peroxyacetate, 2,2-bis(t-butylperoxy)butane, 2,2-bis(t-butylperoxy)octane, 2,5-dimethyl-2,5-di(benzoylperoxy)hexane, bis(t-butylperoxy)isophthalate, isobutyryl peroxide, di(trimethylsilyl) peroxide, and trimethylsilyl triphenylsilyl peroxide; 2-hydroxy-2-methyl-1-phenylpropan-1-one, 1-(4-isopropylphenyl)-2-hydroxy-2-methylpropan-1-one, benzoin methyl ether, and methyl-o-benzoyl benzoate, but the radical reaction initiator is not limited to these compounds.

With respect to component (H), it is preferred that the initiator used for initiating or promoting the preliminary reaction in the preparation of the polyphenylene ether-modified butadiene prepolymer and the initiator used for initiating or promoting the curing reaction after the preparation of the polyphenylene ether-modified butadiene prepolymer are separately added before and after the preparation of the polyphenylene ether-modified butadiene prepolymer. In this case, these initiators used as component (H) may be the same or different, and the initiators for each purpose can be used individually or in combination.

With respect to the initiator used for initiating or promoting the preliminary reaction, preferred are peroxyketal organic peroxides, such as 1,1-bis(t-hexylperoxy)-3,3,5-trimethylcyclohexane, 1,1-bis(t-butylperoxy)-2-methylcyclohexane, 1,1-bis(t-hexylperoxy)cyclohexane, 1,1-bis(t-butylperoxy)

cyclohexane, and 2,2-bis[4,4-di(t-butylperoxy)cyclohexyl] propane, and, of these, more preferred are 1,1-bis(t-hexylperoxy)-3,3,5-trimethylcyclohexane, 1,1-bis(t-hexylperoxy)cyclohexane, and 1,1-bis(t-butylperoxy)cyclohexane, and these compounds can be used individually or in combination. With respect to the initiator used for initiating or promoting the curing reaction after the preparation of the polyphenylene ether-modified butadiene prepolymer, preferred are dialkyl peroxide organic peroxides, such as dicumyl peroxide, t-butylcumyl peroxide, 2,5-dimethyl-2,5-bis(t-butylperoxy)hexyne-3, di-t-butyl peroxide, α,α-bis(t-butylperoxy)diisopropylbenzene, and 2,5-dimethyl-2,5-bis(t-butylperoxy)hexane, and, of these, dicumyl peroxide, 2,5-dimethyl-2,5-bis(t-butylperoxy)hexyne-3, and α,α'-bis(t-butylperoxy)diisopropylbenzene are preferred, and these compounds can be used individually or in combination.

In the present invention, the amount of component (H) incorporated can be determined according to the amounts of components (B) and (C) incorporated, and is preferably 0.05 to 10 parts by weight, relative to 100 parts by weight of the total of components (B) and (C). When the amounts of the radical reaction initiators as component (H) separately added before and after the preparation of the polyphenylene ether-modified butadiene prepolymer are in the above range, an appropriate reaction rate can be obtained in the preliminary reaction in the preparation of the polyphenylene ether-modified butadiene prepolymer and excellent curing properties can be obtained in the curing reaction in the production of the metal-clad laminate or multilayer printed circuit board.

In the process of the present invention, (I) a crosslinkable monomer or crosslinkable polymer containing at least one ethylenically unsaturated double bond-containing group in the molecule thereof, (J) at least one flame retardant selected from bromine flame retardants and phosphorus flame retardants, a thermosetting resin, a thermoplastic resin, and/or an additive can be optionally further added in such an amount that properties required when used in a printed circuit board, such as dielectric properties, heat resistance, adhesion (e.g., metallic foil peeling strength, and adhesion to a substrate of glass or the like), resistance to moisture, Tg, and thermal expansion properties, are not sacrificed.

With respect to (I) crosslinkable monomer or crosslinkable polymer containing at least one ethylenically unsaturated double bond-containing group in the molecule thereof, there is no particular limitation, and it is separate from the compound added in the preparation of the polyphenylene ether-modified butadiene prepolymer. Specifically, component (I) is selected from the group consisting of chemically unmodified butadiene polymers and maleimide compounds, and the compounds mentioned above as examples of components (B) and (C) can be used. As examples of chemically unmodified butadiene polymers, there can be mentioned chemically unmodified butadiene polymers having a number average molecular weight of more than 10,000. These compounds can be used individually or in combination. When the compound mentioned above as examples of components (B) and (C) is used as component (I), the compound used as component (I) is separate from the compound added in the preparation of the polyphenylene ether-modified butadiene prepolymer, and therefore, in this case, the amount of component (I) incorporated is distinguished from the amounts of components (B) and (C) incorporated, and a preferred amount of component (I) is separately shown below. When the compound mentioned above as examples of components (B) and (C) is used as component (I), it may be the same as or different from the compound used in the preparation of the polyphenylene ether-modified butadiene prepolymer.

When a chemically unmodified butadiene polymer having a number average molecular weight of more than 10,000 is used as component (I), either one in a liquid state or one in a solid state can be used, and, with respect to the 1,2-vinyl bond ratio and 1,4-bond ratio in the butadiene polymer, there is no particular limitation.

In the present invention, with respect to the amount of component (I) incorporated, there is no particular limitation, but the amount of component (I) incorporated is preferably 2 to 100 parts by weight, more preferably 2 to 80 parts by weight, further preferably 2 to 60 parts by weight, relative to 100 parts by weight of the total of components (A), (B), and (C). When the amount of component (I) incorporated is 100 parts by weight or less, the lowering of the compatibility with the polyphenylene ether-modified butadiene prepolymer or the lowering of Tg is advantageously unlikely to occur.

With respect to the flame retardant as component (J), there is no particular limitation, but, for example, a bromine, phosphorus, or metal hydroxide flame retardant is preferably used. More specifically, examples of the bromine flame retardants include brominated epoxy resins, such as brominated bisphenol A epoxy resins and brominated phenolic novolac epoxy resins; brominated addition-type flame retardants, such as hexabromobenzene, pentabromotoluene, ethylenebis(pentabromophenyl), ethylenebistetrabromophthalimide, 1,2-dibromo-4-(1,2-dibromoethyl)cyclohexane, tetrabromocyclooctane, hexabromocyclododecane, bis(tribromophenoxy)ethane, brominated polyphenylene ether, brominated polystyrene, and 2,4,6-tris(tribromophenoxy)-1,3,5-triazine; and brominated reactive flame retardants containing a group having an unsaturated double bond, such as tribromophenylmaleimide, tribromophenyl acrylate, tribromophenyl methacrylate, tetrabromobisphenol A dimethacrylate, pentabromobenzyl acrylate and styrene bromide.

Examples of the phosphorus flame retardants include aromatic phosphoric acid esters, such as triphenyl phosphate, tricresyl phosphate, trixylenyl phosphate, cresyl diphenyl phosphate, cresyl di-2,6-xylenyl phosphate, and resorcinol bis(diphenyl phosphate); phosphonic acid esters, such as divinyl phenylphosphonate, diallyl phenylphosphonate, and bis(1-butenyl)phenylphosphonate; phosphinic acid esters, such as phenyl diphenylphosphinate, methyl diphenylphosphinate, and 9,10-dihydro-9-oxa-10-phosphaphenanthrene-10-oxide derivatives; phosphazene compounds, such as bis (2-allylphenoxy)phosphazene and dicresylphosphazene; melamine phosphate, melamine pyrophosphate, melamine polyphosphate, melam polyphosphate, ammonium polyphosphate, phosphorus-containing vinylbenzyl compounds, and red phosphorus. Examples of the metal hydroxide flame retardants include magnesium hydroxide and aluminum hydroxide. These flame retardants can be used individually or in combination.

In the present invention, with respect to the amount of component (J) incorporated, there is no particular limitation, but the amount of component (J) incorporated is preferably 5 to 200 parts by weight, more preferably 5 to 150 parts by weight, further preferably 5 to 100 parts by weight, relative to 100 parts by weight of the total of components (A), (B), and (C). When the amount of the flame retardant incorporated is less than 5 parts by weight, the resultant composition tends to have unsatisfactory flame resistance. On the other hand, when the amount of the flame retardant is more than 200 parts by weight, the heat resistance or metallic foil peeling strength of the varnish used in a printed circuit board tends to become poor.

With respect to the thermosetting resin optionally added in the present invention, there is no particular limitation, but specific examples include epoxy resins, cyanate ester resins, phenolic resins, urethane resins, melamine resins, benzoxazine resins, benzocyclobutene resins, and dicyclopentadiene resins, and, a curing agent or curing promoter for the above thermosetting resin can also be used. With respect to the thermoplastic resin optionally added, there is no particular limitation, but specific examples include polyolefins and derivatives thereof, such as polyethylene, polypropylene, polybutene, an ethylene-propylene copolymer, and poly(4-methyl-pentene), polyesters and derivatives thereof, polycarbonate, polyacetal, polysulfone, (meth)acrylic acid ester copolymers, polystyrene, acrylonitrile-styrene copolymers, acrylonitrile-styrene-butadiene copolymers, polyvinyl acetal, polyvinyl butyrals, polyvinyl alcohols, complete hydrogenation products of polybutadiene, polyether sulfone, polyether ketone, polyether imide, polyphenylene sulfite, polyamideimide, polyamide, thermoplastic polyimide, and liquid crystalline polymers, such as aromatic polyesters. With respect to the additive, there is no particular limitation, but specific examples include silane coupling agents, titanate coupling agents, antioxidants, thermal stabilizers, antistatic agents, ultraviolet light absorbers, pigments, colorants, and lubricants. These thermosetting resins, thermoplastic resins, and additives can be used individually or in combination.

In the present invention, the above-mentioned inorganic filler (D) or component (D) dispersed in component (F) and saturated thermoplastic elastomer (E) or component (E) dissolved in component (G) are preliminarily mixed together, and then the resultant mixture, the polyphenylene ether-modified butadiene prepolymer obtained using components (A), (B), and (C), radical reaction initiator (H), and optionally added crosslinkable monomer or crosslinkable polymer (I) containing at least one ethylenically unsaturated double bond-containing group in the molecule thereof, flame retardant (J), and thermosetting resin, thermoplastic resin, and additive are mixed with each other by a known process and stirred to obtain a resin varnish.

The resin varnish of the present invention can be obtained by dissolving or dispersing the above-described resin composition in the present invention in a solvent. When the polyphenylene ether-modified butadiene prepolymer is prepared in the form of a solution, there can be used the polyphenylene ether-modified butadiene prepolymer free of solvent, which is obtained by completely removing the solvent from the polyphenylene ether-modified butadiene prepolymer solution by, e.g., concentration, or the polyphenylene ether-modified butadiene prepolymer solution can be directly used.

When the polyphenylene ether-modified butadiene prepolymer solution is used, for enabling addition of an optimum solvent to improve the solubility or dispersibility of each of components (D) to (J) {especially for widening the range of the amount of the organic solvent used for preliminarily dispersing or dissolving therein component (D) or (E)} or for facilitating production of a resin varnish having an optimum solids content (nonvolatile content) or varnish viscosity in the preparation of a prepreg (application) (for example, so that excellent appearance and an appropriate resin applied amount can be achieved), it is desired that the polyphenylene ether-modified butadiene prepolymer solution having a solids content (nonvolatile content) increased by, e.g., concentration is used. The solution obtained after the concentration advantageously has a nonvolatile content of 40% by weight or more, preferably 50% by weight, but the nonvolatile content of the solution can be appropriately controlled according to the solubility or dispersibility in the above-mentioned mixing of the components and the preparation of the optimum resin varnish for the application workability for a prepreg. When mixing together components (D) and (E), the polyphenylene ether-modified butadiene prepolymer, and other components and stirring them to prepare a varnish, an additional solvent can be added, and the solvent listed above as examples of components (F) and (G) or a solvent other than these solvents can be used in the preparation of the resin varnish. With respect to the solvent other than components (F) and (G), there is no particular limitation, and an alcohol, an ether, an ester, or a nitrogen-containing solvent, such as N,N-dimethylformamide, N,N-dimethylacetamide, or N-methyl-2-pyrrolidone, is used, and specific examples of the individual solvents include those listed above.

When forming a varnish, it is preferred that the amount of the solvent used is controlled so that the solids content (nonvolatile content) of the resin varnish becomes 5 to 80% by weight, but the varnish can be prepared so as to have the optimum solids content (nonvolatile content) or varnish viscosity for the above-mentioned application workability for a prepreg. For example, the varnish preferably has a viscosity at 25° C., as measured using an E-type viscometer, of 10 to 300 mPa·s, more preferably 20 to 200 mPa·s, especially preferably 30 to 150 mPa·s.

Using the above-described resin varnish obtained by the process of the present invention, the prepreg or metal-clad laminate of the present invention can be produced by a known process. For example, the prepreg is obtained by impregnating a reinforced fiber substrate, such as a glass fiber or an organic fiber, with the resin varnish obtained by the present invention and then drying the resultant substrate in a drying oven or the like at a temperature of generally 60 to 200° C., preferably 80 to 170° C. for 2 to 30 minutes, preferably 3 to 15 minutes. Then, one sheet or a plurality of sheets of the prepreg are stacked on one another, and a metallic foil is disposed on one side or both sides of the stacked prepreg and they are heated and/or pressed together under predetermined conditions to obtain a double-sided or single-sided metal-clad laminate. In this case, the heating can be performed preferably at a temperature in the range of from 100 to 250° C., and the pressing can be performed preferably under a pressure in the range of from 0.5 to 10.0 MPa. It is preferred that the heating and pressing are performed simultaneously using, e.g., a vacuum press, and, in this case, these treatments are preferably performed for 30 minutes to 10 hours. The prepreg or metal-clad laminate produced as described above is subjected to circuit fabrication processing and bonding processing for forming a multilayer circuit, such as perforation, metal plating, and etching for metallic foil, in accordance with a known process to obtain a single-sided, double-sided, or multilayer printed circuit board.

The present invention is not limited to the above-described embodiments, and can be arbitrarily changed or modified as long as the object aimed at by the present invention is attained.

EXAMPLES

Hereinbelow, the present invention will be described in more detail with reference to the following Examples, which should not be construed as limiting the scope of the present invention.

Preparation of Resin Varnish

Preparation Example 1

(a) In a one-liter separable flask equipped with a thermometer, a reflux condenser, a vacuum evaporator, and a stirrer were placed 350 parts by weight of toluene and 50 parts by weight of polyphenylene ether (S202A, manufactured by Asahi Kasei Chemicals Corporation; Mn: 16,000) as component (A), and the solid component was dissolved by stirring at a temperature of 90° C. inside the flask. Then, to the resultant solution were added 100 parts by weight of a chemically unmodified butadiene polymer (B-3000, manufactured by NIPPON SODA CO., LTD.; Mn: 3,000; 1,2-vinyl structure: 90%) as component (B), 40 parts by weight of bis(4-maleimidophenyl)methane (BMI-1000, manufactured by DAIWA KASEI CO., LTD.) as component (C), and methyl isobutyl ketone (MIBK) as a solvent in such an amount that the solids content (nonvolatile content) of the resultant solution became 30% by weight, and stirring was continued and dissolution or uniform dispersion of the components was confirmed. Then, the temperature of the resultant solution or dispersion was increased to 110° C. While maintaining the temperature at 110° C., 0.5 part by weight of 1,1-bis(t-hexylperoxy)-3,3,5-trimethylcyclohexane (PERHEXA TMH, manufactured by NOF CORPORATION) as a reaction initiator was added to the solution or dispersion. A preliminary reaction was then effected for about one hour while stirring to obtain a polyphenylene ether-modified butadiene prepolymer solution having (A) a polyphenylene ether, (B) chemically unmodified butadiene polymer, and (C) crosslinking agent compatibilized with one another. A conversion rate of the bis(4-maleimidophenyl)methane in the polyphenylene ether-modified butadiene prepolymer solution was measured by gel permeation chromatography. As a result, it was found that the conversion rate was 33%. The conversion rate is a value obtained by subtracting the amount of unconverted bis(4-maleimidophenyl)methane (measured value) from 100. Then, the temperature of the solution in the flask was adjusted to 80° C. The solution was then concentrated while stirring so that the solids content of the solution became 45% by weight.

(b) Subsequently, 171 parts by weight (120 parts by weight in terms of the solids) of a slurry (solids content: 70% by weight; solvent: MIBK) of spherical silica (SO-25R, manufactured by Admatechs Co., Ltd.; average particle size: 0.5 µm) as component (D), which had preliminarily been subjected to surface treatment with vinyltrimethoxysilane (KBM-1003, manufactured by Shin-Etsu Chemical Co., Ltd.) in a treated amount of 2% by weight using MIBK as component (F), and 120 parts by weight (30 parts by weight in terms of the solids) of a solution of a saturated thermoplastic elastomer {hydrogenation product of a styrene-butadiene copolymer; Tuftec H1043, styrene content: 67%, styrene-(ethylene-butylene)-styrene block polymer (SEBS), manufactured by Asahi Kasei Chemicals Corporation} as component (E) preliminarily dissolved in toluene as component (G) were mixed together, and the above-obtained polyphenylene ether-modified butadiene polymer solution was added to the resultant mixture. Then, 5 parts by weight of α,α'-bis(t-butylperoxy)diisopropylbenzene (PERBUTYL P, manufactured by NOF CORPORATION) as component (H) was added to the mixture, followed by addition of methyl ethyl ketone (MEK), to prepare a resin varnish (solids content: about 40% by weight) in Preparation Example 1.

Preparation Example 2

(a) A polyphenylene ether-modified butadiene prepolymer was obtained in substantially the same manner as in Preparation Example 1 except that, instead of the bis(4-maleimidophenyl)methane used in item (a) of Preparation Example 1, 30 parts by weight of polyphenylmethanemaleimide (BMI-2000, manufactured by DAIWA KASEI CO., LTD.) was used. A conversion rate of BMI-2000 in the polyphenylene ether-modified butadiene prepolymer solution was measured by gel permeation chromatography. As a result, it was found that the conversion rate was 35%.

(b) Subsequently, into 50 parts by weight of MIBK as component (F) were mixed 110 parts by weight of spherical silica (SO-25R, manufactured by Admatechs Co., Ltd.; average particle size: 0.5 µm) as component (D), 2.4 parts by weight of p-styryltrimethoxysilane (KBM-1403, manufactured by Shin-Etsu Chemical Co., Ltd.), and 120 parts by weight (30 parts by weight in terms of the solids) of a solution of a saturated thermoplastic elastomer {hydrogenation product of a styrene-butadiene copolymer; Tuftec H1043, styrene content: 67%, styrene-(ethylene-butylene)-styrene block polymer (SEBS), manufactured by Asahi Kasei Chemicals Corporation} as component (E) preliminarily dissolved in toluene as component (G) to form a mixed solution. To the mixed solution was added the above-obtained polyphenylene ether-modified butadiene polymer solution. Then, 5 parts by weight of α,α'-bis(t-butylperoxy)diisopropylbenzene (PERBUTYL P, manufactured by NOF CORPORATION) as component (H) was added to the mixture, followed by addition of methyl ethyl ketone (MEK), to prepare a resin varnish (solids content: about 40% by weight) in Preparation Example 2.

Preparation Example 3

(a) A polyphenylene ether-modified butadiene prepolymer was obtained in substantially the same manner as in Preparation Example 1 except that, instead of the bis(4-maleimidophenyl)methane used in item (a) of Preparation Example 1, 35 parts by weight of 2,2-bis[4-(4-maleimidophenoxy)phenyl]propane (BMI-4000, manufactured by DAIWA KASEI CO., LTD.) was used. A conversion rate of BMI-4000 in the polyphenylene ether-modified butadiene prepolymer solution was measured by gel permeation chromatography. As a result, it was found that the conversion rate was 25%.

(b) Subsequently, a resin varnish (solids content: about 40% by weight) in Preparation Example 3 was prepared in substantially the same manner as in Preparation Example 1 except that, instead of KBM-1003 used as a surface treatment agent as component (D) in item (b) of Preparation Example 1, N-phenyl-3-aminopropyltrimethoxysilane (KBM-573, manufactured by Shin-Etsu Chemical Co., Ltd.) was used, and that, instead of H1043 as component (E), Tuftec H1051 {styrene content: 42%; styrene-(ethylene-butylene)-styrene block polymer (SEBS), manufactured by Asahi Kasei Chemicals Corporation} was used.

Preparation Example 4

A polyphenylene ether-modified butadiene prepolymer was obtained in substantially the same manner as in Preparation Example 1 except that, instead of the bis(4-maleimidophenyl)methane used in item (a) of Preparation Example 1, 40 parts by weight of bis(3-ethyl-5-methyl-4-maleimidophenyl)methane (BMI-5100, manufactured by DAIWA KASEI CO., LTD.) was used. A conversion rate of BMI-5100 in the polyphenylene ether-modified butadiene prepolymer solution was measured by gel permeation chromatography. As a result, it was found that the conversion rate was 30%.

(b) Subsequently, a resin varnish (solids content: about 40% by weight) in Preparation Example 4 was prepared in substantially the same manner as in Preparation Example 1 except that, instead of H1043 used as component (E) in item (b) of Preparation Example 1, Tuftec H1051 was used.

Preparation Example 5

(a) A polyphenylene ether-modified butadiene prepolymer was obtained in substantially the same manner as in Preparation Example 1 except that, instead of the bis(4-maleimidophenyl)methane used in item (a) of Preparation Example 1, 15 parts by weight of N-phenylmaleimide (IMILEX-P, manufactured by NIPPON SHOKUBAI CO., LTD.) was used. A conversion rate of IMILEX-P in the polyphenylene ether-modified butadiene prepolymer solution was measured by gel permeation chromatography. As a result, it was found that the conversion rate was 32%.

(b) Subsequently, 171 parts by weight (120 parts by weight in terms of the solids) of a slurry (solids content: 70% by weight; solvent: MIBK) of SO-25R as component (D), which had preliminarily been subjected to surface treatment with vinyltrimethoxysilane (KBM-1003, manufactured by Shin-Etsu Chemical Co., Ltd.) in a treated amount of 2% by weight using MIBK as component (F), and 120 parts by weight (30 parts by weight in terms of the solids) of a solution of a saturated thermoplastic elastomer {hydrogenation product of a styrene-butadiene copolymer; Tuftec H1043, styrene content: 67%, styrene-(ethylene-butylene)-styrene block polymer (SEBS), manufactured by Asahi Kasei Chemicals Corporation} as component (E) preliminarily dissolved in toluene as component (G) were mixed together. Then, to the resultant mixture were added 50 parts by weight of methyl ethyl ketone (MEK) and 25 parts by weight of 2,2-bis[4-(4-maleimidophenoxy)phenyl]propane (BMI-4000, manufactured by DAIWA KASEI CO., LTD.) as component (I), and the mixture was heated at 70° C. for one hour to dissolve BMI-4000. Then, the resultant solution was cooled to 50° C. or lower, and the above-obtained polyphenylene ether-modified butadiene prepolymer and 5 parts by weight of α,α'-bis(t-butylperoxy)diisopropylbenzene (PERBUTYL P, manufactured by NOF CORPORATION) as component (H) were added to the solution, followed by addition of MEK, to prepare a resin varnish (solids content: about 40% by weight) in Preparation Example 5.

Preparation Example 6

(a) A polyphenylene ether-modified butadiene prepolymer was obtained in substantially the same manner as in item (a) of Preparation Example 5 except that, instead of N-phenylmaleimide, 15 parts by weight of bis(4-maleimidophenyl)methane (BMI-1000, manufactured by DAIWA KASEI CO., LTD.) was used. A conversion rate of BMI-1000 in the polyphenylene ether-modified butadiene prepolymer solution was measured by gel permeation chromatography. As a result, it was found that the conversion rate was 32%.

(b) Subsequently, 171 parts by weight (120 parts by weight in terms of the solids) of a slurry (solids content: 70% by weight; solvent: MIBK) of SO-25R as component (D), which had preliminarily been subjected to surface treatment with vinyltrimethoxysilane (KBM-1003, manufactured by Shin-Etsu Chemical Co., Ltd.) in a treated amount of 2% by weight using MIBK as component (F), and 120 parts by weight (30 parts by weight in terms of the solids) of a solution of a saturated thermoplastic elastomer {hydrogenation product of a styrene-butadiene copolymer; Tuftec H1053, styrene content: 29%, styrene-(ethylene-butylene)-styrene block polymer (SEBS), manufactured by Asahi Kasei Chemicals Corporation} as component (E) preliminarily dissolved in toluene as component (G) were mixed together. Then, to the resultant mixture were added 50 parts by weight of methyl ethyl ketone (MEK) and 25 parts by weight of 2,2-bis[4-(4-maleimidophenoxy)phenyl]propane (BMI-4000, manufactured by DAIWA KASEI CO., LTD.) as component (I), and the mixture was heated at 70° C. for one hour to dissolve BMI-4000. Then, the resultant solution was cooled to 50° C. or lower, and the above-obtained polyphenylene ether-modified butadiene prepolymer, 70 parts by weight of ethylenebis(pentabromophenyl) (SAYTEX 8010, manufactured by Albemarle Corporation) as a flame retardant as component (J), and 5 parts by weight of α,α'-bis(t-butylperoxy)diisopropylbenzene (PERBUTYL P, manufactured by NOF CORPORATION) as component (H) were added to the solution, followed by addition of methyl ethyl ketone (MEK), to prepare a resin varnish (solids content: about 40% by weight) in Preparation Example 6.

Preparation Example 7

(a) A polyphenylene ether-modified butadiene prepolymer was obtained in substantially the same manner as in item (a) of Preparation Example 5 except that, instead of N-phenylmaleimide, bis(3-ethyl-5-methyl-4-maleimidophenyl)methane (BMI-5100, manufactured by DAIWA KASEI CO., LTD.) was used. A conversion rate of BMI-5100 in the polyphenylene ether-modified butadiene prepolymer solution was measured by gel permeation chromatography. As a result, it was found that the conversion rate was 35%.

(b) Subsequently, a resin varnish (solids content: about 40% by weight) in Preparation Example 7 was prepared in substantially the same manner as in Preparation Example 6 except that, instead of H1053 used as component (E) in item (b) of Preparation Example 6, 20 parts by weight of an acid anhydride-modified elastomer obtained from a hydrogenation product of a styrene-butadiene copolymer (Tuftec M1913, styrene content: 30%, manufactured by Asahi Kasei Chemicals Corporation) was used, and that, instead of ethylenebis(pentabromophenyl) as a flame retardant as component (J), 70 parts by weight of ethylenebistetrabromophthalimide (BT-93W, manufactured by Albemarle Corporation) was used.

Preparation Example 8

(a) A polyphenylene ether-modified butadiene prepolymer was obtained in substantially the same manner as in Preparation Example 1 except that, instead of B-3000 as a chemically unmodified butadiene polymer as component (B), Ricon 142 (manufactured by Sartomer Company; Mn: 3,900; 1,2-vinyl structure: 55%) was used, and that, instead of bis(4-maleimidophenyl)methane as component (C), 20 parts by weight of divinylbiphenyl (manufactured by Nippon Steel Chemical Co. Ltd.) was used. A conversion rate of the divinylbiphenyl in the polyphenylene ether-modified butadiene prepolymer solution was measured by gel permeation chromatography. As a result, it was found that the conversion rate was 30%.

(b) Subsequently, using the obtained solution, a resin varnish (solids content: about 40% by weight) in Preparation Example 8 was prepared in substantially the same manner as in Preparation Example 7 except that the amount of the silica slurry used in item (b) of Preparation Example 6 was changed to 143 parts by weight (100 parts by weight in terms of the solids), and that, instead of ethylenebis(pentabromophenyl), 70 parts by weight of brominated polystyrene (PBS-64HW, manufactured by Great Lakes Chemical Corporation) was used.

Preparation Example 9

(a) A polyphenylene ether-modified butadiene prepolymer was obtained in the same manner as in item (a) of Preparation Example 1. A conversion rate of the bis(4-maleimidophenyl)methane (BMI-1000, manufactured by DAIWA KASEI CO., LTD.) in the polyphenylene ether-modified butadiene prepolymer solution was measured by gel permeation chromatography. As a result, it was found that the conversion rate was 30%.

(b) Subsequently, 1,000 parts by weight (700 parts by weight in terms of the solids) of a slurry (solids content: 70% by weight; solvent: MIBK) of strontium titanate (SL 250, manufactured by FUJI TITANIUM INDUSTRY CO., LTD.; average particle size: 0.85 μm) as component (D), which had preliminarily been subjected to surface treatment with a titanate coupling agent (PLENACT KR-TTS, manufactured by Ajinomoto Fine-Techno Co., Ltd.) in a treated amount of 2% by weight in MIBK as component (F), and 120 parts by weight (30 parts by weight in terms of the solids) of a solution of a saturated thermoplastic elastomer {hydrogenation product of a styrene-butadiene copolymer; Tuftec H1043, styrene content: 67%, styrene-(ethylene-butylene)-styrene block polymer (SEBS), manufactured by Asahi Kasei Chemicals Corporation} as component (E) preliminarily dissolved in toluene as component (G) were mixed together, and the above-obtained polyphenylene ether-modified butadiene polymer solution was added to the resultant mixture, and 5 parts by weight of α,α'-bis(t-butylperoxy)diisopropylbenzene (PERBUTYL P, manufactured by NOF CORPORATION) as component (H) was further added thereto, followed by addition of methyl ethyl ketone (MEK), to prepare a resin varnish (solids content: about 40% by weight) in Preparation Example 9.

Comparative Preparation Example 1

(a) In a one-liter separable flask equipped with a thermometer, a reflux condenser, and a stirrer were placed 200 parts by weight of toluene and 50 parts by weight of polyphenylene ether (S202A, manufactured by Asahi Kasei Chemicals Corporation; Mn: 16,000), and the solid component was dissolved by stirring at a temperature of 90° C. inside the flask. Then, to the resultant solution was added 100 parts by weight of triallyl isocyanurate (TAIL, manufactured by Nippon Kasei Chemical Co., Ltd.), and dissolution or uniform dispersion of the components was confirmed, followed by cooling to room temperature.

(b) Subsequently, 129 parts by weight (90 parts by weight in terms of the solids) of a slurry (solids content: 70% by weight; solvent: MIBK) of spherical silica (SO-25R, manufactured by Admatechs Co., Ltd.; average particle size: 0.5 μm) as component (D), which had preliminarily been subjected to surface treatment with vinyltrimethoxysilane (KBM-1003, manufactured by Shin-Etsu Chemical Co., Ltd.) in a treated amount of 2% by weight using MIBK as component (F), and 120 parts by weight (30 parts by weight in terms of the solids) of a solution of a saturated thermoplastic elastomer {hydrogenation product of a styrene-butadiene copolymer; Tuftec H1043, styrene content: 67%, styrene-(ethylene-butylene)-styrene block polymer (SEBS), manufactured by Asahi Kasei Chemicals Corporation} as component (E) preliminarily dissolved in toluene as component (G) were mixed together, and the solution prepared in item (a) of Comparative Preparation Example 1 was added to the resultant mixture. Then, 5 parts by weight of α,α'-bis(t-butylperoxy)diisopropylbenzene (PERBUTYL P, manufactured by NOF CORPORATION) as a reaction initiator was added to the mixture, followed by addition of methyl ethyl ketone (MEK), to prepare a resin varnish (solids content: about 40% by weight) in Comparative Preparation Example 1.

Comparative Preparation Example 2

A resin varnish (solids content: about 40% by weight) in Comparative Preparation Example 2 was prepared in substantially the same manner as in Comparative Preparation Example 1 except that, instead of the triallyl isocyanurate used in item (a) of Comparative Preparation Example 1, 100 parts by weight of bis(3-ethyl-5-methyl-4-maleimidophenyl)methane (BMI-5100, manufactured by DAIWA KASEI CO., LTD.) was used.

Comparative Preparation Example 3

A resin varnish (solids content: about 40% by weight) in Comparative Preparation Example 3 was prepared in substantially the same manner as in Comparative Preparation Example 1 except that, instead of triallyl isocyanurate, 100 parts by weight of a chemically unmodified butadiene polymer (B-3000, manufactured by NIPPON SODA CO., LTD.; Mn: 3,000; 1,2-vinyl structure: 90%) was used.

Comparative Preparation Example 4

A resin varnish (solids content: about 40% by weight) in Comparative Preparation Example 4 was prepared in substantially the same manner as in Comparative Preparation Example 1 except that the amount of the triallyl isocyanurate (TAIC, manufactured by Nippon Kasei Chemical Co., Ltd.) used in item (a) of Comparative Preparation Example 1 was changed to 50 parts by weight and 100 parts by weight of a chemically unmodified butadiene polymer (B-3000, manufactured by NIPPON SODA CO., LTD.; Mn: 3,000; 1,2-vinyl structure: 90%) was added, and that the amount of the spherical silica (SO-25R) was changed to 130% by weight.

Comparative Preparation Example 5

A resin varnish (solids content: about 40% by weight) in Comparative Preparation Example 5 was prepared in substantially the same manner as in Comparative Preparation Example 4 except that, instead of triallyl isocyanurate, 30 parts by weight of bis(4-maleimidophenyl)methane (BMI-1000, manufactured by DAIWA KASEI CO., LTD.) was used, and that the amount of the spherical silica (SO-25R) was changed to 110% by weight.

Comparative Preparation Example 6

(a) In a one-liter separable flask equipped with a thermometer, a reflux condenser, a vacuum evaporator, and a stirrer were placed 350 parts by weight of toluene and 50 parts by weight of polyphenylene ether (S202A, manufactured by Asahi Kasei Chemicals Corporation; Mn: 16,000), and the solid component was dissolved by stirring at a temperature of 90° C. inside the flask. Then, to the resultant solution were added 100 parts by weight of glycol-modified 1,2-polybutadiene having a hydroxyl group at the end thereof (G-3000, manufactured by NIPPON SODA CO., LTD.; Mn: 3,000; 1,2-vinyl structure: 90%), 40 parts by weight of bis(4-maleimidophenyl)methane (BMI-1000, manufactured by DAIWA KASEI CO., LTD.), and methyl isobutyl ketone (MIBK) in such an amount that the solids content (nonvolatile content) of the resultant solution became 30% by weight. Dissolution or uniform dispersion of the components was confirmed.

Then, while maintaining the temperature at 110° C., 0.5 part by weight of 1,1-bis(t-hexylperoxy)-3,3,5-trimethylcyclohexane (PERHEXA TMH, manufactured by NOF CORPORATION) as a reaction initiator was added to the resultant solution or dispersion, and a preliminary reaction was effected for about 10 minutes while stirring. A conversion rate of BMI-1000 in the preliminary reaction product was measured by gel permeation chromatography. As a result, it was found that the conversion rate was 4%. (b) A resin varnish (solids content: about 40% by weight) in Comparative Preparation Example 6 was prepared in the same manner as in item (b) of Preparation Example 1.

Comparative Preparation Example 7

A preliminary reaction product was obtained in substantially the same manner as in Comparative Preparation Example 6 except that, instead of glycol-modified 1,2-polybutadiene, 100 parts by weight of carboxylic acid-modified 1,2-polybutadiene having a carboxyl group at the end thereof (C-1000, manufactured by NIPPON SODA CO., LTD.; Mn: 1,400; 1,2-vinyl structure: 89%) was used. A conversion rate of BMI-1000 in the preliminary reaction product was measured by gel permeation chromatography. As a result, it was found that the conversion rate was 19%. Subsequently, using the obtained solution, a resin varnish (solids content: about 40% by weight) in Comparative Preparation Example 7 was prepared in the same manner as in Comparative Preparation Example 6.

Comparative Preparation Example 8

A resin varnish (solids content: about 40% by weight) in Comparative Preparation Example 8 was prepared in substantially the same manner as in Preparation Example 1 except that, instead of the saturated thermoplastic elastomer used as component (E) in item (b) of Preparation Example 1, an unsaturated elastomer {styrene-butadiene copolymer; Tufprene 125, styrene content: 40%; styrene-(ethylene-butylene)-styrene block polymer (SBS), manufactured by Asahi Kasei Chemicals Corporation} was used.

Comparative Preparation Example 9

A resin varnish (solids content: about 40% by weight) in Comparative Preparation Example 9 was prepared in substantially the same manner as in Preparation Example 1 except that the solution of saturated thermoplastic elastomer {hydrogenation product of a styrene-butadiene copolymer; Tuftec H1043, styrene content: 67%, styrene-(ethylene-butylene)-styrene block polymer (SEBS), manufactured by Asahi Kasei Chemicals Corporation} as component (E) preliminarily dissolved in toluene as component (G) in item (b) of Preparation Example 1 was not used.

Comparative Preparation Example 10

A resin varnish (solids content: about 40% by weight) in Comparative Preparation Example 10 was prepared in substantially the same manner as in Preparation Example 1 except that the slurry of spherical silica (SO-25R, manufactured by Admatechs Co., Ltd.; average particle size: 0.5 μm) as component (D), which had preliminarily been subjected to surface treatment with vinyltrimethoxysilane (KBM-1003, manufactured by Shin-Etsu Chemical Co., Ltd.) in a treated amount of 2% by weight using MIBK as component (F), in item (b) of Preparation Example 1 was not used.

Comparative Preparation Example 11

(a) A preliminary reaction product of polybutadiene was obtained in the presence of polyphenylene ether in the same manner as in item (a) of Preparation Example 1. A conversion rate of BMI-1000 in the preliminary reaction solution was measured by gel permeation chromatography. As a result, it was found that the conversion rate was 24%.

(b) Subsequently, to the above-obtained solution was added 171 parts by weight (120 parts by weight in terms of the solids) of a slurry (solids content: 70% by weight; solvent: MIBK) of spherical silica (SO-25R, manufactured by Admatechs Co., Ltd.; average particle size: 0.5 μm) as component (D), which had preliminarily been subjected to surface treatment with vinyltrimethoxysilane (KBM-1003, manufactured by Shin-Etsu Chemical Co., Ltd.) in a treated amount of 2% by weight using MIBK as component (F), and then 120 parts by weight (30 parts by weight in terms of the solids) of a solution of a saturated thermoplastic elastomer {hydrogenation product of a styrene-butadiene copolymer; Tuftec H1043, styrene content: 67%, styrene-(ethylene-butylene)-styrene block polymer (SEBS), manufactured by Asahi Kasei Chemicals Corporation} as component (E) preliminarily dissolved in toluene as component (G) was added to the mixture. Then, 5 parts by weight of α,α'-bis(t-butylperoxy)diisopropylbenzene (PERBUTYL P, manufactured by NOF CORPORATION) as component (H) was added to the mixture, followed by addition of methyl ethyl ketone (MEK), to prepare a resin varnish (solids content: about 40% by weight) in Comparative Preparation Example 11.

Comparative Preparation Example 12

(a) In a one-liter separable flask equipped with a thermometer, a reflux condenser, a vacuum evaporator, and a stirrer were placed 350 parts by weight of toluene, 100 parts by weight of a chemically unmodified butadiene polymer (B-3000, manufactured by NIPPON SODA CO., LTD.; Mn: 3,000; 1,2-vinyl structure: 90%), and 40 parts by weight of bis(4-maleimidophenyl)methane (BMI-1000, manufactured by DAIWA KASEI CO., LTD.), and methyl isobutyl ketone (MIBK) as a solvent was added thereto in such an amount that the solids content (nonvolatile content) of the resultant solution became 25% by weight, and the solid components were dissolved by stirring at a temperature of 110° C. inside the flask. Then, while maintaining the resultant solution at that temperature, 0.5 part by weight of 1,1-bis(t-hexylperoxy)-3,3,5-trimethylcyclohexane (PERHEXA TMH, manufactured by NOF CORPORATION) as a reaction initiator was added to the solution, and a preliminary reaction was effected for about 30 minutes while stirring to obtain a solution of the preliminary reaction product of the chemically unmodified butadiene polymer and crosslinking agent (bismaleimide). Then, to the obtained solution was added 50 parts by weight of polyphenylene ether (S202A, manufactured by Asahi Kasei Chemicals Corporation; Mn: 16,000) while stirring (the solution was slightly opaque). A conversion rate of the bis(4-maleimidophenyl)methane in the solution was measured by gel permeation chromatography. As a result, it was found that the conversion rate was 33%. Then, the temperature of the solution in the flask was adjusted to 80° C., and the solution was then concentrated while stirring so that the solids content of the solution became 45% by weight.

(b) A resin varnish (solids content: 40% by weight) in Comparative Preparation Example 12 was prepared in substantially the same manner as in Preparation Example 1 except that, instead of the polyphenylene ether-modified butadiene prepolymer prepared in item (a) of Preparation Example 1, the solution prepared in item (a) of Comparative Preparation Example 11 was used in item (b) of Preparation Example 1.

Comparative Preparation Example 13

A resin varnish (solids content: about 40% by weight) in Comparative Preparation Example 13 was prepared in substantially the same manner as in Preparation Example 5 except that the temperature at which the polyphenylene ether-modified butadiene polymer was added was changed from 50° C. to 80° C.

The amounts of the raw materials used in the preparation of the resin varnishes in Preparation Examples 1 to 9 and Comparative Preparation Examples 1 to 13 and the results of measurement of viscosity at 25° C. (using an E-type viscometer) of the prepared varnishes are summarized and shown in Table 1.

TABLE 1

|  |  | Preparation Example |  |  |  |  |  |  |  |  | Comparative Preparation Example |  |  |  |  |
|---|---|---|---|---|---|---|---|---|---|---|---|---|---|---|---|
|  |  | 1 | 2 | 3 | 4 | 5 | 6 | 7 | 8 | 9 | 1 | 2 | 3 | 4 | 5 |
| Polyphenylene ether |  | 50 | 50 | 50 | 50 | 50 | 50 | 50 | 50 | 50 | 50 | 50 | 50 | 50 | 50 |
| Butadiene homopolymer |  | 100 | 100 | 100 | 100 | 100 | 100 | 100 | 100 | 100 |  |  | 100 | 100 | 100 |
| Glycol-modified polybutadiene |  |  |  |  |  |  |  |  |  |  |  |  |  |  |  |
| Carboxylic acid-modified polybutadiene |  |  |  |  |  |  |  |  |  |  |  |  |  |  |  |
| Crosslinking agent | BMI-1000 | 40 |  |  |  |  | 15 |  | 40 |  |  |  |  |  | 30 |
|  | BMI-2000 |  | 30 |  |  |  |  |  |  |  |  |  |  |  |  |
|  | BMI-4000 |  |  | 35 |  | 25 | 25 | 25 |  |  |  |  |  |  |  |
|  | BMI-5100 |  |  |  | 40 |  |  |  | 15 |  |  |  | 100 |  |  |
|  | IMILEX-P |  |  |  | 15 |  |  |  |  |  |  |  |  |  |  |
|  | Divinylbiphenyl |  |  |  |  |  |  | 20 |  |  |  |  |  |  |  |
| TAIC |  |  |  |  |  |  |  |  |  |  | 100 |  |  | 50 |  |
| Reaction initiator | PERHEXA TMH | 0.5 | 0.5 | 0.5 | 0.5 | 0.5 | 0.5 | 0.5 | 0.5 | 0.5 |  |  |  |  |  |
|  | PERBUTYL P | 5 | 5 | 5 | 5 | 5 | 5 | 5 | 5 | 5 | 5 | 5 | 5 | 5 | 5 |
| Saturated elastomer | H1043 | 30 | 30 |  |  |  |  | 30 | 30 |  | 30 | 30 | 30 | 30 | 30 |
|  | H1051 |  |  | 30 | 30 | 30 |  |  |  |  |  |  |  |  |  |
|  | H1053 |  |  |  |  |  | 30 |  |  |  |  |  |  |  |  |
|  | M1913 |  |  |  |  |  |  |  |  | 30 |  |  |  |  |  |
| Unsaturated elastomer | Tufprene 125 |  |  |  |  |  |  |  |  |  |  |  |  |  |  |
| Inorganic filler | SO-25R | 120 | 110 | 120 | 120 | 120 | 120 | 120 | 100 |  | 90 | 90 | 90 | 130 | 110 |
|  | SL250 |  |  |  |  |  |  |  |  | 700 |  |  |  |  |  |
| Silane coupling agent | KBM-1003 | 2 |  |  | 2 | 2 | 2 | 2 | 2 |  | 2 | 2 | 2 | 2 | 2 |
|  | KBM-1403 |  | 2 |  |  |  |  |  |  |  |  |  |  |  |  |
|  | KBM-573 |  |  | 2 |  |  |  |  |  |  |  |  |  |  |  |
|  | KR-TTS |  |  |  |  |  |  |  |  | 2 |  |  |  |  |  |
| Flame retardant | SAYTEX801O |  |  |  |  |  | 70 |  |  |  |  |  |  |  |  |
|  | BT-93W |  |  |  |  |  |  | 70 |  |  |  |  |  |  |  |
|  | PBS-64HW |  |  |  |  |  |  |  | 70 |  |  |  |  |  |  |
| Varnish viscosity (mPa·s, 25° C., E-type) |  | 92 | 95 | 80 | 78 | 83 | 110 | 120 | 125 | 102 | 65 | 72 | 160 | 140 | 121 |

|  |  | Comparative Preparation Example |  |  |  |  |  |  |  |
|---|---|---|---|---|---|---|---|---|---|
|  |  | 6 | 7 | 8 | 9 | 10 | 11 | 12 | 13 |
| Polyphenylene ether |  | 50 | 50 | 50 | 50 | 50 | 50 | 50 | 50 |
| Butadiene homopolymer |  |  |  | 100 | 100 | 100 | 100 | 100 | 100 |
| Glycol-modified polybutadiene |  | 100 |  |  |  |  |  |  |  |
| Carboxylic acid-modified polybutadiene |  |  | 100 |  |  |  |  |  |  |
| Crosslinking agent | BMI-1000 | 40 | 40 | 40 | 40 | 40 | 40 | 40 |  |
|  | BMI-2000 |  |  |  |  |  |  |  |  |
|  | BMI-4000 |  |  |  |  |  |  |  | 25 |
|  | BMI-5100 |  |  |  |  |  |  |  |  |
|  | IMILEX-P |  |  |  |  |  |  |  | 15 |
|  | Divinylbiphenyl |  |  |  |  |  |  |  |  |
| TAIC |  |  |  |  |  |  |  |  |  |
| Reaction initiator | PERHEXA TMH | 0.5 | 0.5 | 0.5 | 0.5 | 0.5 | 0.5 | 0.5 | 0.5 |
|  | PERBUTYL P | 5 | 5 | 5 | 5 | 5 | 5 | 5 | 5 |
| Saturated elastomer | H1043 | 30 | 30 |  |  | 30 | 30 | 30 |  |
|  | H1051 |  |  |  |  |  |  |  | 30 |
|  | H1053 |  |  |  |  |  |  |  |  |
|  | M1913 |  |  |  |  |  |  |  |  |
| Unsaturated elastomer | Tufprene 125 |  |  |  | 30 |  |  |  |  |
| Inorganic filler | SO-25R | 120 | 120 | 120 | 120 |  | 120 | 120 | 120 |
|  | SL250 |  |  |  |  |  |  |  |  |
| Silane coupling agent | KBM-1003 | 2 | 2 | 2 | 2 |  | 2 | 2 | 2 |
|  | KBM-1403 |  |  |  |  |  |  |  |  |
|  | KBM-573 |  |  |  |  |  |  |  |  |
|  | KR-TTS |  |  |  |  |  |  |  |  |
| Flame retardant | SAYTEX801O |  |  |  |  |  |  |  |  |
|  | BT-93W |  |  |  |  |  |  |  |  |
|  | PBS-64HW |  |  |  |  |  |  |  |  |
| Varnish viscosity (mPa·s, 25° C., E-type) |  | 115 | 134 | 84 | 65 | 210 | 85 | 88 | 78 |

(The amount of each material is indicated by part or parts by weight, except for the amount of coupling agent, which is an amount (wt %) used in the treatment, based on the weight of the inorganic filler.)

The abbreviations shown in the table have the following meanings.

BMI: Bismaleimide compound
IMILEX-P: N-Phenylmaleimide
TAIC: Triallyl isocyanurate
PERHEXA TMH: 1,1-Bis(t-hexylperoxy)-3,3,5-trimethylcyclohexane
PERBUTYL P: α,α'-Bis(t-butylperoxy)diisopropylbenzene
H1043: Hydrogenation product of a styrene-butadiene copolymer
H1051: Hydrogenation product of a styrene-butadiene copolymer
H1053: Hydrogenation product of a styrene-butadiene copolymer
M1913: Acid anhydride-modified elastomer obtained from a hydrogenation product of a styrene-butadiene copolymer
SO-25R: Spherical silica
SL 250: Strontium titanate
KBM-1003: Vinyltrimethoxysilane
KBM-1403: p-Styryltrimethoxysilane
KBM-573: N-Phenyl-3-aminopropyltrimethoxysilane
KR-TTS: Titanate coupling agent
SAYTEX 8010: Ethylenebis(pentabromophenyl)
BT-93W: Ethylenebistetrabromophthalimide
PBS-64HW: Brominated polystyrene Fabrication of Prepreg Glass cloth having a thickness of 0.1 mm (E glass, manufactured by Nitto Boseki Co., Ltd.) was impregnated with each of the resin varnishes obtained in Preparation Examples 1 to 9 and Comparative Preparation Examples 1 to 13, and then dried by heating at 100° C. for 5 minutes to form prepregs in Fabrication Examples 1 to 9 and Comparative Fabrication Examples 1 to 13, each having a resin content of 50% by weight (54% by weight in the system containing the inorganic filler). The prepregs using the resin varnishes in Preparation Examples 1 to 9 correspond to Fabrication Examples 1 to 9, respectively, and the prepregs using the resin varnishes in Comparative Preparation Examples 1 to 13 correspond to Comparative Fabrication Examples 1 to 13, respectively.

Evaluation of Prepreg

With respect to each of the prepregs in Fabrication Examples 1 to 9 and Comparative Fabrication Examples 1 to 13, appearance and tackiness were evaluated. The results of the evaluation are shown in Table 2. The appearance of the prepreg was visually evaluated, and a prepreg having poor surface smoothness such that irregularities, streaks, or the like were caused in the surface of the prepreg was rated "X", and a prepreg having a smooth surface such that no irregularities, streaks, or the like were caused in the surface of the prepreg was rated "O". With respect to the evaluation of tackiness of the prepreg, a prepreg having a surface which was sticky (tacky) at 25° C. was rated "X", and a prepreg other than such a prepreg was rated "O".

Production of Double-Sided Copper-Clad Laminate

With respect to each of the prepregs in Fabrication Examples 1 to 9 and Comparative Fabrication Examples 1 to 13, four sheets of the prepreg were stacked on one another, and on the upper and lower surfaces of the resultant stacked article were respectively disposed low-profile copper foils each having a thickness of 18 μm (F3-WS, manufactured by THE FURUKAWA ELECTRIC CO., LTD.; M-side Rz: 3 μm) so that the M side of each copper foil was in contact with the surface of the stacked article, and they were together pressed while heating under pressing conditions at 200° C. under 2.9 MPa for 70 minutes to produce a double-sided copper-clad laminate (thickness: 0.5 mm) Further, with respect to each of the prepregs in Fabrication Example 1 and Comparative Fabrication Example 1, a double-sided copper-clad laminate using a general copper foil having a thickness of 18 μm (GTS, manufactured by THE FURUKAWA ELECTRIC CO., LTD.; M-side Rz: 8 μm) was produced under the same pressing conditions as those in the Examples using a low-profile copper foil. The combinations of the prepregs in Fabrication Examples 1 to 9 and Comparative Fabrication Examples 1 to 13 and the copper foils used in the copper-clad laminates in Examples 1 to 10 and Comparative Examples 1 to 14 are shown in Table 2.

Evaluation of Properties of Double-sided Copper-clad Laminate

With respect to each of the copper-clad laminates in Examples 1 to 10 and Comparative Examples 1 to 14, transmission loss, dielectric properties, copper foil peeling strength, resistance to soldering heat, thermal expansion coefficient, and Tg were evaluated. The results of the evaluation are shown in Table 2. The processes for evaluation of the properties of a copper-clad laminate are as follows.

Measurement of Transmission Loss and Dielectric Properties

A transmission loss of a copper-clad laminate was measured by a triplate-line resonator method using a vector-type network analyzer. Conditions for the measurement were as follows: line width: 0.6 mm; insulating layer distance between the upper and lower ground conductors: about 1.0 mm; line length: 200 mm; characteristic impedance: about 50Ω; frequency: 3 GHz; and measurement temperature: 25° C. From the obtained transmission loss, dielectric properties (relative permittivity and dielectric loss tangent) at 3 GHz were determined by making a calculation. Further, dielectric properties (relative permittivity and dielectric loss tangent) were measured with respect to the copper-clad laminate which had been kept in a machine for pressure cooker test (PCT) (conditions: 121° C., 2.2 atm.) for 5 hours. Conditions for the measurement were the same as those for the above measurement in the ordinary state.

Measurement of Copper Foil Peeling Strength

A copper foil peeling strength of a copper-clad laminate was measured in accordance with JIS-C-6481 test standard for copper-clad laminate.

Evaluation of Resistance to Soldering Heat of Copper-Clad Laminate

The copper foil on the both sides or one side of the copper-clad laminate cut into 50 mm square was etched, and the resultant laminate, which was in the ordinary state, or which had been kept in a machine for pressure cooker test (PCT) (conditions: 121° C., 2.2 atm.) for a predetermined time (1, 3, or 5 hours), was immersed in molten solder at 288° C. for 20 seconds, and the appearance of the resultant copper-clad laminate (three sheets) was visually evaluated. The figures shown in the table below mean, among the three sheets of copper-clad laminate which had been immersed in the solder, the number of the sheet(s) of copper-clad laminate in which the occurrence of blister or measling within the substrate (within the insulating layer) and between the substrate and the copper foil was not recognized.

Measurement of Thermal Expansion Coefficient and Tg of Copper-clad Laminate

The copper foils on the both sides of the copper-clad laminate were etched, and a thermal expansion coefficient (in the thicknesswise direction, at 30 to 130° C.) and Tg of the copper-clad laminate cut into 5 mm square were measured by a TMA.

TABLE 2

| | Resin varnish | Prepreg | Copper foil | Prepreg properties Appearance | Tackiness | Relative permittivity (3 GHz) In ordinary state | After 5 h PCT |
|---|---|---|---|---|---|---|---|
| Example 1 | Preparation Example 1 | Fabrication Example 1 | Low-profile foil | ○ | ○ | 3.38 | 3.48 |
| Example 2 | Preparation Example 1 | Fabrication Example 1 | General foil | ○ | ○ | 3.38 | 3.48 |
| Example 3 | Preparation Example 2 | Fabrication Example 2 | Low-profile foil | ○ | ○ | 3.41 | 3.52 |
| Example 4 | Preparation Example 3 | Fabrication Example 3 | Low-profile foil | ○ | ○ | 3.37 | 3.46 |
| Example 5 | Preparation Example 4 | Fabrication Example 4 | Low-profile foil | ○ | ○ | 3.37 | 3.44 |
| Example 6 | Preparation Example 5 | Fabrication Example 5 | Low-profile foil | ○ | ○ | 3.37 | 3.45 |
| Example 7 | Preparation Example 6 | Fabrication Example 6 | Low-profile foil | ○ | ○ | 3.41 | 3.50 |
| Example 8 | Preparation Example 7 | Fabrication Example 7 | Low-profile foil | ○ | ○ | 3.43 | 3.49 |
| Example 9 | Preparation Example 8 | Fabrication Example 8 | Low-profile foil | ○ | ○ | 3.44 | 3.52 |
| Example 10 | Preparation Example 9 | Fabrication Example 9 | Low-profile foil | ○ | ○ | 9.40 | 9.52 |
| Comparative Example 1 | Comparative Preparation Example 1 | Comparative Fabrication Example 1 | Low-profile foil | ○ | ○ | 3.88 | 4.06 |
| Comparative Example 2 | Comparative Preparation Example 1 | Comparative Fabrication Example 1 | General foil | ○ | ○ | 3.88 | 4.06 |
| Comparative Example 3 | Comparative Preparation Example 2 | Comparative Fabrication Example 2 | Low-profile foil | ○ | ○ | 4.08 | 4.27 |
| Comparative Example 4 | Comparative Preparation Example 3 | Comparative Fabrication Example 3 | Low-profile foil | X | X | 3.45 | 3.55 |
| Comparative Example 5 | Comparative Preparation Example 4 | Comparative Fabrication Example 4 | Low-profile foil | X | X | 3.60 | 3.71 |
| Comparative Example 6 | Comparative Preparation Example 5 | Comparative Fabrication Example 5 | Low-profile foil | X | X | 3.41 | 3.51 |
| Comparative Example 7 | Comparative Preparation Example 6 | Comparative Fabrication Example 6 | Low-profile foil | X | ○ | 3.90 | 4.06 |
| Comparative Example 8 | Comparative Preparation Example 7 | Comparative Fabrication Example 7 | Low-profile foil | ○ | ○ | 3.95 | 4.09 |
| Comparative Example 9 | Comparative Preparation Example 8 | Comparative Fabrication Example 8 | Low-profile foil | ○ | ○ | 3.40 | 3.50 |
| Comparative Example 10 | Comparative Preparation Example 9 | Comparative Fabrication Example 9 | Low-profile foil | ○ | ○ | 3.41 | 3.51 |
| Comparative Example 11 | Comparative Preparation Example 10 | Comparative Fabrication Example 10 | Low-profile foil | ○ | ○ | 3.21 | 3.30 |
| Comparative Example 12 | Comparative Preparation Example 11 | Comparative Fabrication Example 11 | Low-profile foil | ○ | ○ | 3.40 | 3.51 |
| Comparative Example 13 | Comparative Preparation Example 12 | Comparative Fabrication Example 12 | Low-profile foil | X | X | 3.42 | 3.53 |
| Comparative Example 14 | Comparative Preparation Example 13 | Comparative Fabrication Example 13 | Low-profile foil | ○ | ○ | 3.38 | 3.45 |

| | Dielectric loss tangent (3 GHz) In ordinary state | After 5 h PCT | Transmission loss (In ordinary state) (dB/m, 3 GHz) | Peeling strength (kN/m) | Resistance to soldering heat (In ordinary state or after PCT treatment) In ordinary state | After 1 h | After 3 h | After 5 h | Tg (° C.) | Thermal expansion coefficient (ppm/° C.) |
|---|---|---|---|---|---|---|---|---|---|---|
| Example 1 | 0.0026 | 0.0047 | 3.36 | 0.85 | 3 | 3 | 3 | 3 | 177 | 53 |
| Example 2 | 0.0026 | 0.0047 | 4.02 | 1.17 | 3 | 3 | 3 | 3 | 177 | 53 |
| Example 3 | 0.0027 | 0.0048 | 3.42 | 0.87 | 3 | 3 | 3 | 3 | 180 | 52 |
| Example 4 | 0.0026 | 0.0047 | 3.34 | 0.97 | 3 | 3 | 3 | 3 | 174 | 54 |
| Example 5 | 0.0026 | 0.0045 | 3.35 | 0.86 | 3 | 3 | 3 | 3 | 178 | 49 |
| Example 6 | 0.0026 | 0.0045 | 3.35 | 0.96 | 3 | 3 | 3 | 3 | 174 | 55 |
| Example 7 | 0.0026 | 0.0046 | 3.38 | 0.98 | 3 | 3 | 3 | 3 | 175 | 54 |
| Example 8 | 0.0025 | 0.0045 | 3.32 | 0.91 | 3 | 3 | 3 | 3 | 177 | 50 |
| Example 9 | 0.0026 | 0.0046 | 3.40 | 0.91 | 3 | 3 | 3 | 3 | 172 | 59 |
| Example 10 | 0.0025 | 0.0045 | 5.66 | 0.82 | 3 | 3 | 3 | 3 | 178 | 59 |
| Comparative Example 1 | 0.0050 | 0.0101 | 4.95 | 0.57 | 3 | 3 | 3 | 1 | 174 | 59 |
| Comparative Example 2 | 0.0050 | 0.0101 | 5.66 | 0.93 | 3 | 3 | 3 | 3 | 174 | 59 |
| Comparative Example 3 | 0.0148 | 0.0208 | 10.44 | 0.74 | 3 | 3 | 3 | 2 | 203 | 48 |
| Comparative Example 4 | 0.0032 | 0.0052 | 3.78 | 0.49 | 3 | 2 | 0 | 0 | 158 | 82 |
| Comparative Example 5 | 0.0040 | 0.0080 | 4.24 | 0.56 | 3 | 3 | 1 | 0 | 165 | 75 |

TABLE 2-continued

| | | | | | | | | | | |
|---|---|---|---|---|---|---|---|---|---|---|
| Comparative Example 6 | 0.0032 | 0.0052 | 3.76 | 0.56 | 3 | 1 | 0 | 0 | 168 | 69 |
| Comparative Example 7 | 0.0136 | 0.0196 | 9.63 | 0.74 | 3 | 3 | 2 | 0 | 164 | 78 |
| Comparative Example 8 | 0.0147 | 0.0206 | 10.19 | 0.83 | 3 | 2 | 1 | 0 | 160 | 73 |
| Comparative Example 9 | 0.0028 | 0.0048 | 3.47 | 0.84 | 3 | 3 | 3 | 3 | 143 | 52 |
| Comparative Example 10 | 0.0028 | 0.0049 | 3.48 | 0.83 | 3 | 3 | 3 | 3 | 177 | 52 |
| Comparative Example 11 | 0.0028 | 0.0048 | 3.41 | 0.85 | 3 | 3 | 3 | 3 | 177 | 61 |
| Comparative Example 12 | 0.0027 | 0.0052 | 3.42 | 0.85 | 3 | 3 | 3 | 3 | 177 | 53 |
| Comparative Example 13 | 0.0029 | 0.0052 | 3.48 | 0.55 | 3 | 3 | 0 | 0 | 169 | 59 |
| Comparative Example 14 | 0.0026 | 0.0048 | 3.35 | 0.93 | 3 | 3 | 3 | 0 | 173 | 56 |

As apparent from Table 2, in each of Examples 1 to 10 in which the resin varnish of the present invention was used, the prepreg properties are excellent such that the appearance is free of irregularities, streaks, and the like and hence is smooth and further free of tackiness (surface stickness). In each of the Examples except Example 10 which was intended for the increase of the permittivity, the laminate properties are excellent such that the relative permittivity is 3.44 or less and the dielectric loss tangent is 0.0027 or less. The resistance to soldering heat is excellent such that the occurrence of lifting or measling is not recognized in any of the three samples for measurement. The thermal expansion properties are excellent such that the thermal expansion coefficient is 59 ppm/° C. or less.

With respect to the transmission loss and peeling strength, in Example 2 in which the resin varnish of the present invention and a general foil were used, the transmission loss was remarkably excellent, with a value of 4.02, and the peeling strength was also excellent with a value of 1.17 kN/m, as compared to those in Comparative Example 2 in which a general foil was used similarly.

The copper-clad laminate in each of the Examples in which the resin varnish of the present invention and a low-profile foil were used, except Example 10 which was intended for the increase of the permittivity, the transmission loss is as especially excellent as 3.42 or less, and the peeling strength is as high as 0.82 kN/m or more even though the low-profile foil is used. From this, it is apparent that the resin varnish of the present invention can very advantageously achieve both the reduction of transmission loss and the improvement of peeling strength.

Comparative Examples 1 and 2 are of a system in which an inorganic filler and a saturated elastomer are used in combination in a resin system comprising a polyphenylene ether and triallyl isocyanurate, and Comparative Example 1 corresponds to Patent documents 4 and 5 using a low-profile foil instead of the general foil and Comparative Example 2 using a general foil corresponds to Patent documents 4 and 5. In this system, the prepreg properties and thermal expansion coefficient are excellent, but the relative permittivity, dielectric loss tangent, and transmission loss are poor. When using a low-profile foil, the peeling strength is poor, and further the resistance to soldering heat is poor, and thus the performance is collectively unsatisfactory.

Comparative Example 3 is of a system in which an inorganic filler and a saturated elastomer are used in combination in a resin system comprising a polyphenylene ether and a bismaleimide compound, and corresponds to Patent document 2 using a low-profile foil instead of the general foil. In this system, the prepreg properties and thermal expansion coefficient are excellent, but the relative permittivity, dielectric loss tangent, and transmission loss are poor, and the peeling strength is low and further the resistance to soldering heat is poor, and thus the performance is collectively unsatisfactory.

Comparative Example 4 is of a system in which an inorganic filler and a saturated elastomer are used in combination in a conventional resin system comprising a polyphenylene ether and a butadiene homopolymer which are not compatibilized with each other, and corresponds to Patent documents 6 and 7 using a low-profile foil instead of the general foil. In this system, the relative permittivity, dielectric loss tangent, and transmission loss are excellent, but the prepreg properties, peeling strength, resistance to soldering heat, and thermal expansion coefficient are poor, and thus the performance is collectively unsatisfactory. This system has suffered macro phase separation, and therefore can be easily distinguished by visual observation from a sample using the compatibilized composition in the present invention.

Comparative Example 5 is of a system in which an inorganic filler and a saturated elastomer are used in combination in a conventional resin system comprising a polyphenylene ether, a butadiene homopolymer, and triallyl isocyanurate which are not compatibilized with one another. In this system, the relative permittivity, dielectric loss tangent, and transmission loss are unsatisfactory, and the prepreg properties, peeling strength, resistance to soldering heat, and thermal expansion coefficient are poor, and thus the performance is collectively poor. This system has suffered macro phase separation, and therefore can be easily distinguished by visual observation from a sample using the compatibilized composition in the present invention.

Comparative Example 6 is of a system in which an inorganic filler and a saturated elastomer are used in combination in a resin system comprising a polyphenylene ether, a butadiene homopolymer, and a maleimide compound, and corresponds to the resin composition comprising the same components as those in the present invention, which are not compatibilized with one another. In this system, the relative permittivity, dielectric loss tangent, and transmission loss are unsatisfactory, and the prepreg properties, peeling strength, resistance to soldering heat, and thermal expansion coefficient are poor, and thus the performance is collectively poor. This system has suffered macro phase separation, and therefore can be easily distinguished by visual observation from a sample using the compatibilized composition in the present invention.

Comparative Example 7 is of a system in which an inorganic filler and a saturated elastomer are used in combination in a conventional resin system comprising a polyphenylene ether, glycol-modified polybutadiene, and a maleimide compound which are not compatibilized with one another, and corresponds to Patent document 8 using a low-profile foil instead of the general foil. In this system, the relative permittivity, dielectric loss tangent, and transmission loss are poor, and further the peeling strength, resistance to soldering heat, and thermal expansion coefficient are poor, and thus the performance is collectively poor. This system has suffered macro phase separation, and therefore can be easily distinguished by visual observation from a sample using the compatibilized composition in the present invention.

Comparative Example 8 is of a system in which an inorganic filler and a saturated elastomer are used in combination in a resin system comprising a polyphenylene ether, carboxylic acid-modified polybutadiene, and a maleimide compound, and corresponds to Patent document 8 using a low-profile foil instead of the general foil. In this system, the relative permittivity, dielectric loss tangent, and transmission loss are poor, and further the peeling strength, resistance to soldering heat, and thermal expansion coefficient are poor, and thus the performance is collectively poor.

Comparative Example 9 is of a system in which an inorganic filler and an unsaturated elastomer are used in combination in a resin system comprising a polyphenylene ether, a butadiene homopolymer, and a maleimide compound. In this system, the transmission loss and Tg are poor, as compared to those in Example 1 of the present invention.

Comparative Example 10 corresponds to substantially the same system as in Example 1 except that the saturated thermoplastic elastomer is not used. In this system, the prepreg properties, peeling strength, resistance to soldering heat, thermal expansion coefficient, and Tg are excellent, but the relative permittivity, dielectric loss tangent, and transmission loss are slightly poor, as compared to those in Example 1.

Comparative Example 11 corresponds to substantially the same system as in Example 1 except that the inorganic filler is not used. In this system, the prepreg properties, relative permittivity, peeling strength, resistance to soldering heat, and Tg are excellent, but the dielectric loss tangent, transmission loss, and thermal expansion coefficient are slightly poor, as compared to those in Example 1.

Comparative Example 12 corresponds to substantially the same system as in Example 1 except that the process for mixing together the inorganic filler and thermoplastic elastomer is changed. In this system, the prepreg properties, peeling strength, resistance to soldering heat, and Tg are excellent, but the relative permittivity, dielectric loss tangent, transmission loss, and moisture absorption dependency of the dielectric properties are slightly poor, as compared to those in Example 1.

Comparative Example 13 is of a system in which a butadiene homopolymer and a bismaleimide compound are preliminarily reacted to obtain a prepolymer, and then a polyphenylene ether is added to the obtained prepolymer, wherein the prepolymer obtained from the butadiene homopolymer and bismaleimide compound and the polyphenylene ether are not compatibilized with each other. In this system, the relative permittivity, dielectric loss tangent, and transmission loss are slightly unsatisfactory, and the prepreg properties, peeling strength, resistance to soldering heat, and thermal expansion coefficient are slightly poor, as compared to those in Example 1.

Comparative Example 14 is of a system in which the polyphenylene ether-modified butadiene polymer is added at 80° C., and, in this system, the dielectric loss tangent after moisture absorption and resistance to soldering heat are slightly poor, as compared to those in Example 5 in which the polyphenylene ether-modified butadiene polymer is added at 50° C.

Comparison is made between the low-profile foil and the general foil when the same resin varnish and prepreg are used. As apparent from Examples 1 and 2 or Comparative Examples 1 and 2, the low-profile foil is excellent in the transmission loss. On the other hand, the low-profile foil is poor in the metallic foil peeling strength (peeling strength). Particularly, in Comparative Example 1 in which a low-profile foil is used for the conventional resin composition, the transmission loss is 4.95 dB/m (low-profile foil), which is slightly improved, as compared to the transmission loss (5.66 dB/m) of the general foil. On the other hand, the peeling strength for the low-profile foil is 0.57 kN/m, which is poor, as compared to the peeling strength (0.93 kN/m) for the general foil, and which is practically unsatisfactory. These results substantiate the fact that, as mentioned above in connection with the problems accompanying the prior art, the low-profile foil is more effective in reducing the transmission loss than a general foil, but, conversely, a general foil is more effective in improving the metallic foil peeling strength than the low-profile foil, and therefore it has been difficult to achieve both the reduction of transmission loss and the required metallic foil peeling strength.

INDUSTRIAL APPLICABILITY

In the resin composition in the present invention, the thermosetting resin composition comprising a combination of the compatibilized uncured semi-IPN composite, inorganic filler, and saturated thermoplastic elastomer is advantageous not only in that, when used in a printed circuit board, it exhibits excellent dielectric properties and reduces the transmission loss in a high frequency band, namely, it exhibits excellent electrical properties and excellent heat resistance after moisture absorption as well as low thermal expansion properties, but also in that it has metallic foil peeling strength satisfactorily improved. When an attempt is made to achieve both the reduction of dielectric loss by the improvement of the dielectric properties and the reduction of conductor loss by the use of a metallic foil having small surface roughness, the resin varnish, prepreg, and metal-clad laminate of the present invention can satisfactorily reduce the transmission loss in a high frequency band, and therefore can advantageously be used in the production of a printed circuit board used in the high frequency field.

The present invention is advantageously used in the application of a member or part for printed circuit board for use in various electric or electronic devices, e.g., mobile communication devices using high frequency signals in a high frequency band, for example, having a frequency of 1 GHz or more and devices for their base stations, network-associated electronic devices, such as a server and a router, and large-size computers.

The invention claimed is:

1. A process for producing a thermosetting resin varnish containing a thermosetting resin composition, which contains an uncured semi-IPN composite, an inorganic filler, and a saturated thermoplastic elastomer, the process comprising the steps of:
(i) preliminary reacting (B) a butadiene polymer which contains in the molecule thereof 40% or more of a 1,2-butadiene unit having a 1,2-vinyl group in the side chain thereof, and which is not chemically modified and (C) a crosslinking agent, in the presence of (A) a polyphenylene ether to obtain a polyphenylene ether-modified butadiene prepolymer which is an uncured semi-IPN composite;
(ii) mixing together (D) an inorganic filler and (E) a saturated thermoplastic elastomer to obtain a mixture; and
(iii) mixing together the obtained mixture and the polyphenylene ether-modified butadiene prepolymer.

2. The process for producing a thermosetting resin varnish according to claim 1, wherein the step for mixing together the mixture and the polyphenylene ether-modified butadiene prepolymer is performed at a temperature of 60° C. or lower.

3. The process for producing a thermosetting resin varnish according to claim 1, wherein, in the step for obtaining a polyphenylene ether-modified butadiene prepolymer, the polyphenylene ether-modified butadiene prepolymer is obtained by preliminary reacting so that a conversion rate of the component (C) becomes in the range of from 5 to 100%.

4. The process for producing a thermosetting resin varnish according to claim 1, wherein the component (C) contains at least one maleimide compound represented by the general formula (1):

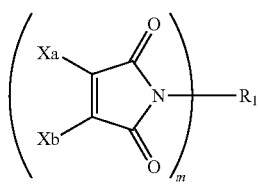

(1)

wherein $R_1$ is an m-valent aliphatic or aromatic organic group, Xa and Xb may be the same or different and each is a monovalent atom or organic group selected from hydrogen atom, halogen atom, and an aliphatic organic group, and m represents an integer of 1 or more.

5. The process for producing a thermosetting resin varnish according to claim 1, wherein the component (C) is at least one maleimide compound selected from the group consisting of N-phenylmaleimide, N-(2-methylphenyl)maleimide, N-(4-methylphenyl)maleimide, N-(2,6-dimethylphenyl)maleimide, N-(2,6-diethylphenyl)maleimide, N-(2-methoxyphenyl)maleimide, N-benzylmaleimide, N-dodecylmaleimide, N-isopropylmaleimide, and N-cyclohexylmaleimide.

6. The process for producing a thermosetting resin varnish according to claim 1, wherein the component (C) is at least one maleimide compound represented by the following general formula (2):

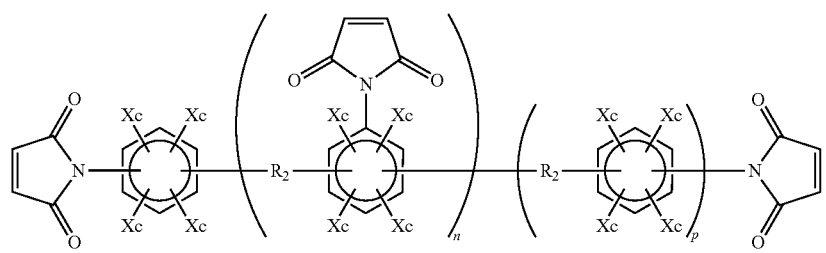

(2)

wherein each $R_2$ is $-C(Xc)_2-$, $-CO-$, $-O-$, $-S-$, $-SO_2-$, or a single bond, and each $R_2$ may be the same or different, and each Xc is an alkyl group having 1 to 4 carbon atoms, $-CF_3$, $-OCH_3$, $-NH_2$, a halogen atom, or a hydrogen atom, and each Xc may be the same or different, and their substitution positions on the benzene are independent of one another, and each of n and p represents 0 or an integer of 1 to 10.

7. The process for producing a resin varnish according to claim 1, wherein the component (C) is at least one maleimide compound selected from the group consisting of 2,2-bis[4-(4-maleimidophenoxy)phenyl]propane, bis(3-ethyl-5-methyl-4-maleimidophenyl)methane, polyphenylmethanemaleimide, and bis(4-maleimidophenyl)methane.

8. The process for producing a resin varnish according to claim 1, wherein the component (C) is at least one vinyl compound containing divinylbiphenyl.

9. The process for producing a thermosetting resin varnish according to claim 1, wherein the inorganic filler as component (D) is an inorganic filler selected from alumina, titanium oxide, mica, silica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clay such as calcined clay, talc, aluminum borate, and silicon carbide, or a mixture of two or more inorganic fillers comprising at least one of those.

10. The process for producing a thermosetting resin varnish according to claim 1, wherein the inorganic filler as component (D) is silica or strontium titanate having a particle size of 0.01 to 30 μm.

11. The process for producing a thermosetting resin varnish according to claim 1, wherein the inorganic filler as component (D) has been subjected to surface treatment with at least one coupling agent selected from silane coupling agents and titanate coupling agents.

12. The process for producing a thermosetting resin varnish according to claim 1, wherein the inorganic filler as component (D) has been subjected to surface treatment with a vinyl group-containing silane coupling agent.

13. The process for producing a thermosetting resin varnish according to claim 1, wherein the inorganic filler as said component (D) is preliminarily dispersed in (F) an organic solvent to form a slurry, and then the slurry and the saturated thermoplastic elastomer (E) are mixed together.

14. The process for producing a thermosetting resin varnish according to claim 13, wherein the organic solvent (F) is at least one organic solvent comprising a ketone solvent.

15. The process for producing a thermosetting resin varnish according to claim 1, wherein the saturated thermoplastic elastomer as component (E) is at least one saturated thermoplastic elastomer comprising a saturated thermoplastic elastomer obtained by hydrogenating an unsaturated double bond-containing group in the butadiene moiety of a styrene-butadiene copolymer.

16. The process for producing a thermosetting resin varnish according to claim 1, wherein the saturated thermoplastic elastomer as component (E) is preliminarily dissolved in (G) a second organic solvent, and then the resultant solution and the inorganic filler (D) are mixed together.

17. The process for producing a thermosetting resin varnish according to claim 16, wherein the second organic solvent as component (G) is at least one organic solvent comprising an aromatic hydrocarbon solvent or a ketone solvent.

18. The process for producing a thermosetting resin varnish according to claim 1, wherein the amount of the component (A) incorporated is in the range of from 2 to 200 parts by weight, relative to 100 parts by weight of the total amount of the components (B) and (C),
the amount of the component (C) incorporated is in the range of from 2 to 200 parts by weight, relative to 100 parts by weight of the component (B),
the amount of the component (D) incorporated is in the range of from 1 to 1,000 parts by weight, relative to 100 parts by weight of the total amount of the components (A), (B), (C), and (E), and
the amount of the component (E) incorporated is in the range of from 1 to 100 parts by weight, relative to 100 parts by weight of the total amount of the components (A), (B), and (C).

19. The process for producing a thermosetting resin varnish according to claim 1, further comprising the step of adding (H) a radical reaction initiator.

20. The process for producing a thermosetting resin varnish according to claim 1, further comprising the step of adding (I) a crosslinkable monomer or crosslinkable polymer containing at least one ethylenically unsaturated double bond-containing group in the molecule thereof.

21. The process for producing a thermosetting resin varnish according to claim 20, wherein the component (I) is at least one crosslinkable monomer or crosslinkable polymer containing an ethylenically unsaturated double bond-containing group selected from the group consisting of chemically unmodified butadiene polymers and maleimide compounds.

22. The process for producing a thermosetting resin varnish according to claim 1, further comprising the step of adding (J) at least one flame retardant selected from bromine flame retardants and phosphorus flame retardants.

23. A thermosetting resin varnish comprising: a thermosetting resin composition of an uncured semi-IPN composite having compatibilized with one another (A) a polyphenylene ether, (B) a butadiene polymer which contains in the molecule thereof 40% or more of a 1,2-butadiene unit having a 1,2-vinyl group in the side chain thereof, and which is not chemically modified, and (C) a crosslinking agent; (D) an inorganic filler; and (E) a saturated thermoplastic elastomer.

24. The thermosetting resin varnish according to claim 23, which has a viscosity of 10 to 300 mPa·s at 25° C.

25. A resin varnish for printed circuit board, obtained by using the process for producing a thermosetting resin varnish according to claim 1.

26. A prepreg obtained by impregnating a substrate with the thermosetting resin varnish according to claim 23, and then drying the resultant substrate at 60 to 200° C.

27. A metal-clad laminate obtained by stacking one or more sheets of the prepreg according to claim 26 on one another to prepare a stacked prepreg, disposing a metallic foil on one side or both sides of the stacked prepreg, and pressing them together while heating.

28. A prepreg obtained by impregnating a substrate with the resin varnish for printed circuit board according to claim 25, and then drying the resultant substrate at 60 to 200° C.

29. A metal-clad laminate obtained by stacking one or more sheets of the prepreg according to claim 28 on one another to prepare a stacked prepreg, disposing a metallic foil on one side or both sides of the stacked prepreg, and pressing them together while heating.

* * * * *